United States Patent
Rand et al.

(10) Patent No.: US 11,820,928 B2
(45) Date of Patent: Nov. 21, 2023

(54) ORGANIC-INORGANIC HYBRID PEROVSKITE NANOCRYSTALS AND METHODS OF MAKING THE SAME

(71) Applicant: THE TRUSTEES OF PRINCETON UNIVERSITY, Princeton, NJ (US)

(72) Inventors: Barry Rand, Princeton, NJ (US); Ross Kerner, Princeton, NJ (US); Zhengguo Xiao, Plainsboro, NJ (US)

(73) Assignee: THE TRUSTEES OF PRINCETON UNIVERSITY, Princeton, NJ (US)

( * ) Notice: Subject to any disclaimer, the term of this patent is extended or adjusted under 35 U.S.C. 154(b) by 0 days.

(21) Appl. No.: 17/469,429

(22) Filed: Sep. 8, 2021

(65) Prior Publication Data

US 2022/0220372 A1 Jul. 14, 2022

Related U.S. Application Data

(62) Division of application No. 16/095,579, filed as application No. PCT/US2017/023609 on Mar. 22, 2017, now Pat. No. 11,130,910.

(60) Provisional application No. 62/326,312, filed on Apr. 22, 2016.

(51) Int. Cl.
| | | |
|---|---|---|
| *C09K 11/61* | (2006.01) |
| *H01L 33/00* | (2010.01) |
| *C09K 11/06* | (2006.01) |
| *C30B 29/60* | (2006.01) |
| *C30B 29/12* | (2006.01) |
| *C30B 7/14* | (2006.01) |
| *H10K 30/30* | (2023.01) |
| *H10K 50/135* | (2023.01) |
| *H10K 85/30* | (2023.01) |
| *C09K 11/02* | (2006.01) |
| *H01G 9/20* | (2006.01) |
| *B82Y 40/00* | (2011.01) |
| *B82Y 30/00* | (2011.01) |
| *H10K 30/00* | (2023.01) |
| *B82Y 20/00* | (2011.01) |

(52) U.S. Cl.
CPC ............ *C09K 11/06* (2013.01); *C09K 11/025* (2013.01); *C30B 7/14* (2013.01); *C30B 29/12* (2013.01); *C30B 29/60* (2013.01); *H01G 9/2009* (2013.01); *H10K 30/30* (2023.02); *H10K 50/135* (2023.02); *H10K 85/30* (2023.02); *B82Y 20/00* (2013.01); *B82Y 30/00* (2013.01); *B82Y 40/00* (2013.01); *C09K 2211/10* (2013.01); *H10K 30/00* (2023.02)

(58) Field of Classification Search
CPC .......... C01G 21/16; C07F 7/24; C09K 11/06; C09K 11/66; C09K 11/025; H01L 51/00; C30B 29/12; C30B 7/14; C30B 29/60; C01P 2002/34; C01P 2004/64; H10K 50/135; H10K 30/30; H10K 85/30; H10K 30/00; H01G 9/2009; B82Y 20/00; B82Y 30/00; B82Y 40/00
See application file for complete search history.

(56) References Cited

U.S. PATENT DOCUMENTS

2017/0358757 A1* 12/2017 Lee ..................... C01G 21/006

* cited by examiner

*Primary Examiner* — Haidung D Nguyen
(74) *Attorney, Agent, or Firm* — J. Clinton Wimbish; Maynard Nexsen PC

(57) ABSTRACT

Organic-inorganic perovskite nanoparticle compositions are described herein. In some embodiments, a nanoparticle composition comprises a layer of organic-inorganic perovskite nanocrystals, the organic-inorganic perovskite nanocrystals comprising surfaces associated with ligands of size unable to incorporate into octahedral corner sites of the perovskite crystal structure.

19 Claims, 33 Drawing Sheets

ORGANIC-INORGANIC HYBRID PEROVSKITE NANOCRYSTALS AND METHODS OF MAKING THE SAME

RELATED APPLICATION DATA

The present application is a divisional of U.S. patent application Ser. No. 16/095,579 filed Oct. 22, 2018, which is a United States National Phase of PCT/US2017/023609, filed Mar. 22, 2017, which claims priority pursuant to 35 U.S.C. § 119(e) to U.S. Provisional Patent Application Ser. No. 62/326,312 filed Apr. 22, 2016 which is incorporated herein by reference in its entirety.

STATEMENT OF GOVERNMENT RIGHTS

This invention was made with government support under Grant No. N00014-17-1-2005 awarded by the United States Navy, Office of Naval Research and Grant No. D15AP00093 awarded by the United States Department of Defense, Department of the Interior, Defense Advanced Research Projects Agency. The government has certain rights in the invention.

FIELD

The present invention relates to metal halide perovskite compositions and, in particular, to organic-inorganic metal halide perovskite nanoparticles and methods of making the same.

BACKGROUND

Photovoltaics based on organic-inorganic hybrid perovskite semiconductors have achieved substantial progress over recent years. Beyond photovoltaics, perovskites have also been intensively investigated as emerging materials for other optoelectronic applications, such as light-emitting diodes (LEDs) and lasers because of their tunable bandgap, high color purity and low material cost.

However, traditional solution synthesis methods for perovskite nanocrystals have three main drawbacks for device applications. First, the synthesis process is complicated, typically requiring several cycles of purification by washing and centrifugation. Additionally, long and insulating ligands (such as oleylamine and oleic acid) are required for the synthesis of colloidal nanocrystals in solution. Such ligands coat the nanocrystal surface and reduce device performance. Finally, it is difficult to achieve uniform, dense films of colloidal nanocrystals. This is because nanocrystal suspensions saturate at low concentration (approximately 0.5 mg/ml) and, during film formation, substantial aggregation or even transformation into bulk phases compromises film uniformity and prevents the formation of pinhole free films. Some alternative "in-situ" synthesis methods have been proposed, where perovskite nanocrystals can be formed within a polymer matrix during film preparation. Nevertheless, LEDs based on perovskite-polymer matrices suffer from high turn-on voltage and low power efficiency sourcing from large resistivity and injection barriers.

SUMMARY

In view of these disadvantages, organic-inorganic perovskite nanocrystal compositions are described herein which, in some embodiments, provide enhancements to film formation and associated emission characteristics and resistance to light-induced and/or bias-induced spinodal decomposition pathways for mixed halide systems. Methods are also provided herein for the in-situ preparation of organic-inorganic metal halide perovskite nanocrystal layers or films.

In one aspect, a nanoparticle composition comprises a layer of organic-inorganic perovskite nanocrystals, the organic-inorganic perovskite nanocrystals comprising surfaces associated with ligands of size unable to incorporate into octahedral corner sites of the perovskite crystal structure. In some embodiments, the organic-inorganic perovskite nanocrystals are of the formula $ABX_{3-z}Y_z$, wherein A is an organic cation, B is an element selected from the group consisting of transition metals, Group IVA elements and rare earth elements and X and Y are independently selected from Group VIIA elements, wherein $0 \leq z < 3$. Accordingly, organic-inorganic perovskite nanocrystals can be single-halide or mixed-halide compositions. In some embodiments of mixed halide composition, the organic-inorganic perovskite nanocrystals are of the formula $Me_{1-y}A_yBX_{3-z}Y_z$, wherein Me is an alkali metal cation or alkaline earth metal cation, A is an organic cation, B is an element selected from the group consisting of transition metals, Group IVA elements and rare earth elements and X and Y are independently selected from Group VIIA elements, wherein $0 < y < 1$ and wherein $0 < z < 3$. As described further herein, one or more layers of the organic-inorganic perovskite nanocrystals can be employed as photoactive layers of various electronic devices including photovoltaic devices and light emitting diodes (LEDs).

In another aspect, nanoparticle dispersions are provided. A nanoparticle dispersion, in some embodiments, comprises a continuous phase and a nanoparticle phase dispersed in the continuous phase, the nanoparticle phase comprising organic-inorganic perovskite nanocrystals comprising surfaces associated with ligands of size unable to incorporate into octahedral corner sites of the perovskite crystal structure In another aspect, methods of making nanoparticle compositions are described herein. In some embodiments, a method of making a nanoparticle composition comprises providing a mixture including at least one organic-inorganic precursor and at least one additive in a solvent and forming a layer by application of the mixture to a substrate. A non-solvent is applied to remove at least a portion of the solvent from the layer and provide organic-inorganic perovskite nanocrystals comprising surfaces associated with the additive, the additive of size unable to incorporate into octahedral corner sites of the perovskite crystal.

A method of making a nanoparticle composition, in other embodiments, comprises providing a solution including at least one organic-inorganic precursor and an at least one additive in a solvent and forming a dispersion of organic-inorganic perovskite nanocrystals via addition of non-solvent to the solution, the organic-inorganic perovskite nanocrystals comprising surfaces associated with the additive, wherein the additive is of size unable to incorporate into octahedral corner sites of the perovskite crystal structure.

These and other non-limiting embodiments are further described in the following detailed description.

BRIEF DESCRIPTION OF THE DRAWINGS

FIG. 15a is the schematic energy band diagram for the LED device of FIG. 14a.

FIGS. 16d-16f illustrate EL spectra, current density-luminance-voltage (J-L-V) and EQE curves of the LED device of FIG. 17a.

DETAILED DESCRIPTION

Figure 1:
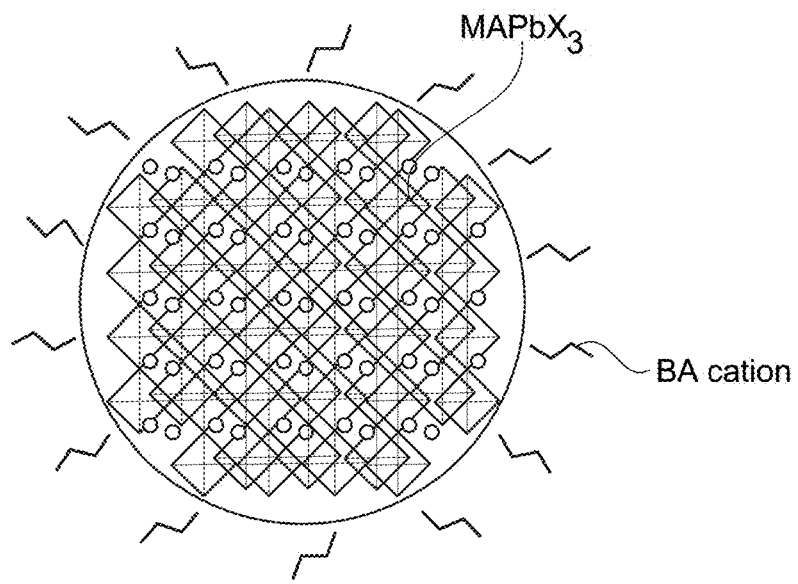
FIG. 1 is a schematic of an organic-inorganic perovskite nanocrystal according to one embodiment described herein.

Embodiments described herein can be understood more readily by reference to the following detailed description and examples and their previous and following descriptions. Elements, apparatus and methods described herein, however, are not limited to the specific embodiments presented in the detailed description and examples. It should be recognized that these embodiments are merely illustrative of the principles of the present invention. Numerous modifications and adaptations will be readily apparent to those of skill in the art without departing from the spirit and scope of the invention.

Definitions

The term "alkyl" as used herein, alone or in combination, refers to a straight or branched saturated hydrocarbon group. For example, an alkyl can be $C_1$-$C_{30}$.

The term "alkenyl" as used herein, alone or in combination, refers to a straight or branched chain hydrocarbon group having at least one carbon-carbon double bond.

The term "aryl" as used herein, alone or in combination, refers to an aromatic monocyclic or multicyclic ring system optionally substituted with one or more ring substituents The term "heteroaryl" as used herein, alone or in combination, refers to an aromatic monocyclic or multicyclic ring system in which one or more of the ring atoms is an element other than carbon, such as nitrogen, oxygen and/or sulfur.

The term "cycloalkyl" as used herein, alone or in combination, refers to a non-aromatic, saturated mono- or multicyclic ring system optionally substituted with one or more ring substituents.

The term "cycloalkenyl" as used herein, alone or in combination, refers to a non-aromatic, mono- or multicyclic ring system having at least one carbon-carbon double bond and is optionally substituted with one or more ring substituents.

The term "heteroalkyl" as used herein, alone or in combination, refers to an alkyl moiety as defined above, having one or more carbon atoms, for example one, two or three carbon atoms, replaced with one or more heteroatoms, which may be the same or different.

II. Nanoparticle Compositions

Organic-inorganic perovskite nanoparticle compositions are described herein. In some embodiments, a nanoparticle composition comprises a layer of organic-inorganic perovskite nanocrystals, the organic-inorganic perovskite nanocrystals comprising surfaces associated with ligands of size unable to incorporate into octahedral corner sites of the perovskite crystal structure. In some embodiments, the organic-inorganic perovskite nanocrystals are of the formula $ABX_{3-z}Y_z$, wherein A is an organic cation, B is an element selected from the group consisting of transition metals, Group IVA elements and rare earth elements and X and Y are independently selected from Group VIIA elements, wherein $0 \leq z < 3$. Accordingly, organic-inorganic perovskite nanocrystals can be single-halide or mixed-halide compositions. Organic cation A can be any organic cation compatible with interstitial spaces of the perovskite structure. In some embodiments, organic cation A is an ammonium ion, alkyl-ammonium ion or formamidinium ion. Alkyl-ammonium ion can include $CH_3NH_3^+$ and/or $CH_3CH_2NH_3^+$, in some embodiments. Moreover, B can be any metal cation compatible with corner sharing $BX_6$ octahedra of the perovskite crystalline structure. In several embodiments described herein, B is lead (Pb) cation, but can be other transition metals or rare earth elements. Additionally, in some embodiments, X and Y are independently selected from Cl, I and Br.

Organic-inorganic perovskite nanocrystals of mixed halide systems can also be of the formula $Me_{1-y}A_yBX_{3-z}Y_z$, wherein Me is an alkali or alkaline earth metal cation, A is an organic cation, B is an element selected from the group consisting of transition metals, Group IVA elements and rare earth elements and X and Y are independently selected from Group VIIA elements, wherein $0 < y < 1$ and wherein $0 \leq z < 3$. Specific examples of A, B, X and Y are provided above. Me can be selected according to several considerations including ability to produce structurally stable mixed-halide perovskites with enhanced atom size tolerance. In some embodiments, Me can mitigate instability issues originating from differences in crystal structure between I- and Br- perovskites. In several embodiments, Me can be cesium (Cs) cation.

As described herein, ligands are associated with surfaces of the organic-inorganic perovskite nanocrystals. Suitable ligands are sufficiently large to prevent or block incorporation of the ligands into octahedral corner sites of the inorganic crystal structure. Any ligand meeting the foregoing size requirement and operable to associate with organic-inorganic perovskite nanocrystal surfaces can be employed. In some embodiments, suitable ligands comprise one or more species of organoammonium ions. Organoammonium ions can comprise one or more substituents selected from the group consisting of alkyl, heteroalkyl, alkenyl, cycloalkyl, cycloalkenyl, heterocycloalkyl, aryl and heteroaryl. For alkyl, heteroalkyl and/or alkenyl ammonium ions, the carbon chain may be sufficiently long and/or branched to meet the octahedral corner size exclusion requirement. Similarly, cycloalkyl, cycloalkenyl, heterocycloalkyl, aryl and/or heteroaryl ammonium ions can present sufficiently large ring structure and/or associated ring substituents to meet the octahedral corner size exclusion requirement. In some embodiments, ligands associated with surfaces of the organic-inorganic perovskite nanocrystals comprise n-butylammonium (BA), 4-fluorophenylmethylammonium (FPMA), phenylammonium and/or phenylalkylammonium, such as phenylethylammonium or phenylmethylammonium.

FIG. 1 is a schematic of an organic-inorganic perovskite nanocrystal according to one embodiment described herein. As illustrated in FIG. 1, the organic-inorganic perovskite nanocrystal is formed of $MAPbX_3$ wherein MA is methylammonium cation. Ligand of n-butylammonium (BA) is associated with surfaces of the $MAPbX_3$ nanocrystal. In some embodiments, ligands form a capping layer on the organic-inorganic perovskite nanocrystals. Such a capping layer can stabilize the organic-inorganic perovskite nanocrystals against various degradative pathways. In some embodiments, for example, the ligands inhibit or preclude phase separation and halide redistribution in mixed halide organic-inorganic perovskite nanocrystals.

Figure 2:
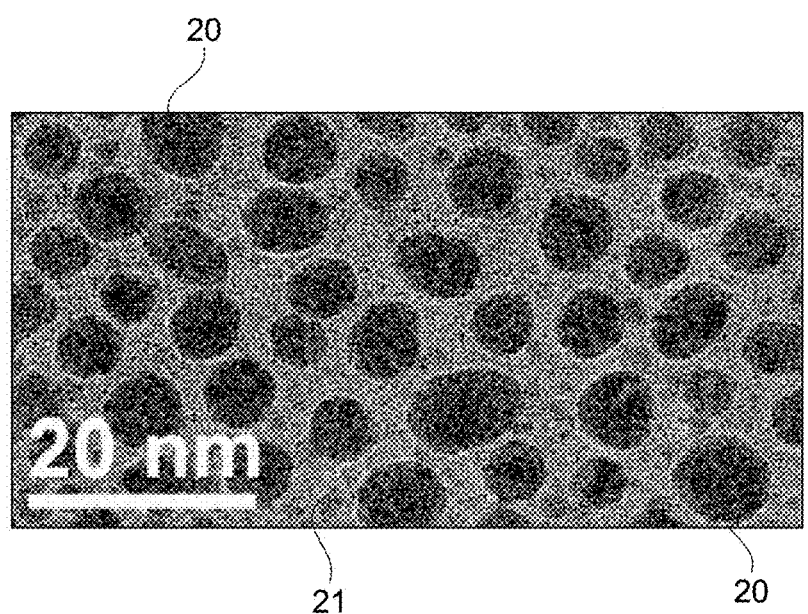
FIG. 2 illustrates one embodiment of organic-inorganic perovskite nanocrystals positioned in a matrix formed by ligands associated with the nanocrystal surfaces.

Moreover, in some embodiments, ligands associated with surfaces of the organic-inorganic perovskite nanocrystals form a matrix in which the organic-inorganic perovskite nanocrystals are positioned or embedded. In some embodiments, the matrix is continuous wherein the organic-inorganic perovskite nanocrystals are dispersed throughout the matrix. FIG. 2 illustrates one embodiment of organic-inorganic perovskite nanocrystals positioned in a matrix formed by ligands associated with the nanocrystal surfaces. In the embodiment of FIG. 2, $MAPbI_3$ (20) nanocrystals are dispersed in matrix (21) formed by FPMA ligand. Matrices formed by ligands can contribute to desirable properties of organic-inorganic perovskite nanocrystal layers. The ligand matrix, for example, can contribute to formation of pinhole free layers and inhibit nanocrystal aggregation.

Organic-inorganic perovskite nanocrystals described herein generally have an average size less than 50 nm. In some embodiments, organic-inorganic perovskite nanocrystals can have an average size less than 20 nm or less than 15 nm. Organic-inorganic perovskite nanocrystals can also have an average size selected from Table I.

TABLE I

| Average Size of Organic-inorganic Perovskite Nanocrystals |
| --- |
| ≤10 nm |
| ≤8 nm |
| 1-20 nm |
| 3-15 nm |
| 3-8 nm |
| 1-5 nm |
| 5-15 nm |

A layer formed of organic-inorganic perovskite nanocrystals described herein, in some embodiments, has root mean square (RMS) surface roughness of less than 10 nm, less than 2 nm or less than 1 nm. For example, a layer formed of organic-inorganic perovskite nanocrystals can have surface roughness (RMS) of 0.3-2 nm or 0.5-1 nm. The extremely smooth surfaces can enhance performance efficiencies of electronic devices incorporating the layers. In some embodiments, for example, the low surface roughness can permit thinner hole and/or electron transport layers and reduce contact resistance.

A layer formed of organic-inorganic perovskite nanocrystals can also exhibit peak light emission across the visible region and into the near infrared region of the electromagnetic spectrum. As detailed in the examples herein, peak emission wavelength from layers of organic-inorganic perovskite nanocrystals can be dependent on several considerations including specific composition and size of the perovskite nanocrystals. Accordingly, organic-inorganic perovskite nanocrystals described herein can be tuned for emission at various wavelengths in the visible and/or infrared regions. Tunable emission in the visible and infrared regions enables application of organic-inorganic perovskite nanocrystals in LED apparatus. Moreover, the organic-inorganic perovskite nanocrystals can have absorption profiles falling within the visible and/or ultraviolet regions. Such absorption properties can enable employment of the organic-inorganic perovskite nanocrystals in photovoltaic apparatus.

A layer formed of organic-inorganic perovskite nanocrystals can have any desired thickness consistent with objectives of the present invention. An organic-inorganic perovskite nanocrystal layer can generally have thickness of 10-200 nm or 20-100 nm. In some embodiments, an organic-inorganic perovskite nanocrystal layer has thickness less than 10 nm or greater than 200 nm. Layer thickness can be dependent upon several considerations including, but not limited to, carrier mobilities in the layer as well as function of the layer. Organic-inorganic perovskite nanocrystal layers employed in photovoltaic applications may have different thicknesses than those employed in LED applications.

As described herein, organic-inorganic perovskite nanocrystals can be also provided as a colloidal dispersion. In such embodiments, the colloidal dispersion of the organic-inorganic perovskite nanocrystals can be spin coated or otherwise deposited on surfaces to provide a photoactive layer. A photoactive layer can be light emitting in some embodiments, such as a photoluminescent layer or electroluminescent layer. Alternatively, a photoactive layer can be a light absorption layer for photovoltaic applications. Colloidal dispersions of organic-inorganic perovskite nanocrystals can enable sequential coatings without dissolving or damaging the underlying layer. Therefore, heterostructures can be formed of organic-inorganic perovskite nanocrystal layers having differing light emission and/or absorption characteristics. In one embodiment, for example, a layer of red emitting $MAPbI_3$ can be combined with a layer of green emitting $MAPbBr_3$. Any combination of organic-inorganic perovskite nanocrystal layers is contemplated, leading to LEDs of varying or tunable color as well as tandem cell photovoltaic devices responsive to multiple regions of the electromagnetic spectrum. In further embodiments, colloidal dispersions can permit combination of organic-inorganic perovskite nanocrystals described herein with traditional 2-dimensional layered perovskite structures for electronic device applications.

An LED incorporating one or more organic-inorganic perovskite nanocrystal layers described herein can have the general construction comprising a first electrode and second electrode. One or both of the first and second electrodes can be radiation transmissive. In some embodiments, for example, the first and/or second electrode can be formed of a radiation transmissive conducting oxide. Radiation transmissive conducting oxides can include one or more of indium tin oxide (ITO), gallium indium tin oxide (GITO), aluminum tin oxide (ATO) and zinc indium tin oxide (ZITO). In some embodiments, a radiation transmissive first and/or second electrode is formed of a polymeric material such as polyanaline (PAM) and its chemical relatives or 3,4-polyethylenedioxythiophene (PEDOT). Further, a radiation transmissive first and/or second electrode can be formed of a carbon nanotube layer having a thickness operable to at least partially pass visible electromagnetic radiation. Additionally, a layer of lithium fluoride (LiF) or lithium oxide ($Li_2O$) can be positioned between the first and/or second electrode and another layer of the device. For example, a layer of LiF or $Li_2O$ can be positioned between an electron dopant layer and electrode.

One or more one or more organic-inorganic perovskite nanocrystal layers described herein are positioned between the first and second electrodes. In some embodiments, one or more hole transport layers (HTL) are positioned between the anode and organic-inorganic perovskite nanocrystal layer(s). Similarly, one or more electron transport layers (ETL) can be positioned between the cathode and organic-inorganic perovskite nanocrystal layer(s). Specific compositional identity of HTLs and ETLs can be dependent upon the electronic structure of the organic-inorganic perovskite nanocrystal layer(s) and electrode composition. In some embodiments, for example, a HTL comprises poly[N,N'-bis(4-butylphenyl)-N,N'-bis(phenyl)-benzidine] (poly-TPD), and an ETL comprises 2,2',2"-(1,3,5-benzinetriyl)-tris(1-phenyl-1-H-benzimidazole) (TPBi). In some embodiments, an LED comprising one or more organic-inorganic perovskite nanocrystal layers described herein exhibits external quantum efficiency (EQE) greater than 8.5% or greater than 9%. In further embodiments, an LED comprising one or more organic-inorganic perovskite nanocrystal layers exhibits EQE greater than 10%.

II. Methods of Making Organic-Inorganic Perovskite Nanocrystals

In another aspect, methods of making nanoparticle compositions are described herein. In some embodiments, a method of making a nanoparticle composition comprises providing a mixture including at least one organic-inorganic precursor and at least one additive in a solvent and forming a layer by application of the mixture to a substrate. A non-solvent is applied to remove at least a portion of the solvent from the layer and provide organic-inorganic perovskite nanocrystals comprising surfaces associated with the additive, the additive of size unable to incorporate into octahedral corner sites of the perovskite crystal structure.

Turning now to specific components, a mixture is provided comprising at least one organic-inorganic precursor material. In some embodiments, an organic-inorganic precursor material is of the formula $ABX_3$ wherein A is an organic cation, B is an element selected from the group consisting of transition metals, Group IVA elements and rare earth elements and X is a Group VIIA element. Cation A can be any organic cation compatible with interstitial spaces of the inorganic perovskite structure. In some embodiments, organic cation A is an ammonium ion, alkyl-ammonium ion or formamidinium ion. Alkyl-ammonium ion can include $CH_3NH_3^+$ (MA) and/or $CH_3CH_2NH_3^+$ (EA), in some embodiments. Moreover, B can be any metal cation compatible with corner sharing $BX_6$ octahedra of the perovskite crystalline structure. In several embodiments described herein, B is lead (Pb) cation, but can be other transition metals or rare earth elements. Additionally, in some embodiments, X is selected from Cl, I and Br. Accordingly, ABX organic-inorganic precursor can be selected from species provided Table II, according to some embodiments.

TABLE II

| Organic-Inorganic Precursor |
|---|
| $MAPbI_3$ |
| $MAPbBr_3$ |
| $MAPbCl_3$ |

Single-halide organic-inorganic precursors can generally be prepared by mixing $BX_2$ and AX in solvent to form $ABX_3$, wherein A, B and X are defined herein.

Alternatively, mixed-halide organic-inorganic perovskite nanocrystals described herein can be prepared from a mixed halide organic-inorganic precursor of the formula $ABX_{3-z}Y_z$, wherein A is an organic cation, B is an element selected from the group consisting of transition metals, Group IVA elements and rare earth elements and X and Y are independently selected from Group VIIA elements, wherein $0 \leq z < 3$. In other embodiments, mixed halide organic-inorganic precursor can be of the formula $Me_{1-y}A_yBX_{3-z}Y_z$, wherein Me is an alkali or alkaline earth metal cation, A, B and X are the same as in $ABX_3$ and $0 < y < 1$ and wherein $0 \leq z < 3$. In some embodiments, mixed halide organic-inorganic precursor is selected from Table III.

TABLE III

| Organic-Inorganic Precursor |
|---|
| $MAPb(X_{3-z}Y_z)$ |
| $Me_{1-y}MA_yPb(X_{3-z}Y_z)$ |
| $MAPb(I_{3-z}Br_z)$ |
| $Cs_{1-y}MA_yPb(I_{3-z}Br_z)$ |

Mixed halide organic-inorganic precursor can generally be prepared by mixing single halide organic-inorganic precursors such as $MAPbI_3$, $MABrI_3$ and/or $CsPbI_3$.

The mixture comprises at least one additive in addition to the organic-inorganic precursor. As described herein, a suitable additive has sufficient size to block or preclude incorporation of the additive into octahedral corner sites of the perovskite crystal structure. For example, additives can comprise one or more organoammonium ion species. Organoammonium ions can comprise one or more substituents selected from the group consisting of alkyl, heteroalkyl, alkenyl, cycloalkyl, cycloalkenyl, heterocycloalkyl, aryl and heteroaryl. For alkyl, heteroalkyl and/or alkenyl ammonium ions, the carbon chain may be sufficiently long and/or branched to satisfy the octahedral corner size exclusion requirement. Similarly, cycloalkyl, cycloalkenyl, heterocycloalkyl, aryl and/or heteroaryl ammonium ions can present sufficiently large ring structure and/or associated ring substituents to meet the octahedral corner size exclusion requirement. In some embodiments, additives comprise n-butylammonium (BA), 4-fluorophenylmethylammonium (FPMA), phenylammonium and/or phenylalkylammonium, such as phenylethylammonium or phenylmethylammonium cations. In some embodiments, organoammonium additive can be added to the mixture in halide form, such as BAI or FPMAI.

The organic-inorganic precursor and additive can be present in the mixture in any amount not inconsistent with the objectives of the present invention. Molar ratio of the additive to the organic-inorganic precursor can be selected according to several considerations including, but not limited to, chemical identities of the additive and organic-inorganic precursor as well as the desired size of organic-inorganic perovskite nanocrystals in the deposited layer. In some embodiments, molar ratio of additive to organic-inorganic precursor is selected from Table IV.

TABLE IV

| Additive:Organic-Inorganic Precursor Molar Ratio |
|---|
| 10:100 |
| 20:100 |
| 40:100 |
| 60:100 |
| 5-60:100 |

The mixture comprising the additive and organic-inorganic precursor in a solvent is applied to a substrate to form a layer. A non-solvent is subsequently applied to the layer to remove at least a portion of solvent from the layer and provide organic-inorganic perovskite nanocrystals comprising surfaces associated with the additive. As the additive is sufficiently large to block its incorporation into octahedral corner sites of the perovskite crystal structure, the additive functions in a ligand capacity as set forth in Section I herein. Therefore, a layer comprising organic-inorganic perovskite nanocrystals is formed in-situ without post processing techniques such as purification cycles, including washing and centrifugation. The layer comprising organic-inorganic perovskite nanocrystals can have any of the properties and/or structures described in Section I herein, including perovskite nanocrystal composition, size and spectral characteristics. As described in Section I, the additive can form a matrix in which the organic-inorganic perovskite nanoparticles are dispersed. While not wishing to be bound by any theory, it is believed that outward growth of perovskite crystals from initial nucleation sites is strongly suppressed by the additive, resulting in sub-10 nm organic-inorganic perovskite nanocrystals with additives (ligands) capping the nanocrystal surfaces. Growth suppression by the additive can work in conjunction with solvent removal from the gelling layer by application of the non-solvent. Removal of the solvent by the non-solvent can halt the morphological evolution, thereby maintaining small perovskite nanocrystallite size.

Suitable solvent for the additive and organic-inorganic precursor can generally comprise one or more polar aprotic solvents including, but not limited to, N,N-dimethylformamide (DMF), dimethylsulfoxide (DMSO), acetonitrile (MeCN) and acetone. In some embodiments of mixed halide systems, more than one solvent is employed depending on solubility requirements of the individual organic-inorganic precursors in the mixture. Any non-solvent not inconsistent with the formation of organic-inorganic perovskite nanocrystals can be employed to remove at least a portion of the solvent from the deposited layer. Suitable non-solvent, in some embodiments, comprises non-polar organics, such as toluene, benzene, chloroform, chlorobenzene or cyclohexane. The non-solvent should exhibit sufficient strength to exchange with or displace the solvent of the layer.

In another aspect, a method of making a nanoparticle composition comprises providing a solution including at least one organic-inorganic precursor and an at least one additive in a solvent. A dispersion of organic-inorganic perovskite nanocrystals is formed via precipitation by the addition of non-solvent to the solution, the organic-inorganic perovskite nanocrystals comprising surfaces associated with the additive, wherein the additive is of size unable to incorporate into octahedral corner sites of the perovskite crystal structure. Organic-inorganic precursors, additives, solvent and non-solvent can be selected from any of the same described in this Section II. Moreover, the dispersion of organic-inorganic perovskite nanocrystals can be formed by flash precipitation with turbulent mixing of the non-solvent with the solution of additive and organic-inorganic precursor. In some embodiments, the mixing apparatus can employ independent feed lines and pumps for delivery of the individual fluid streams to the chamber. In some embodiments, the solution fluid stream and non-solvent fluid stream are simultaneously mixed in the chamber for flash precipitation of the organic-inorganic perovskite nanocrystals. Alternatively, the fluid streams can enter the mixing chamber in any desired order resulting in perovskite nanocrystal production. Advantageously, methods described herein can permit continuous production of organic-inorganic perovskite nanocrystals or batch production of perovskite nanocrystals. Suitable multi-inlet vortex mixing (MIVM) apparatus for methods described herein are described in U.S. Pat. No. 8,137,699 which is incorporated herein by reference in its entirety. In some embodiments, fluid streams enter the mixing chamber at velocities described in U.S. Pat. No. 8,137,699.

Organic-inorganic perovskite nanocrystals of the dispersion can have any properties and/or architecture described in Section I herein including composition, size and spectral characteristics. Moreover, additive of the solution is associated with surfaces of the perovskite nanocrystals in a ligand capacity as described in Section I.

These and other embodiments are further illustrated in the following non-limiting examples.

Example 1

Figure 3A:
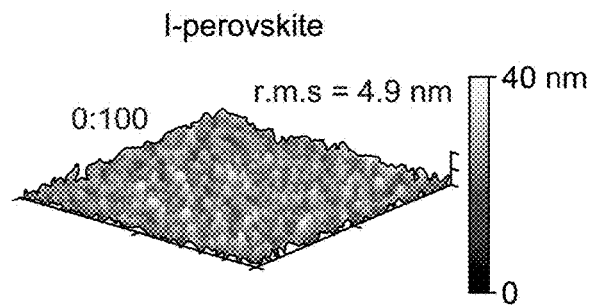
FIGS. 3a-3f are atomic force microscopy images of I-perovskite films having varying molar ratios of n-butylammonium ligand according to some embodiments.
Figure 3B:
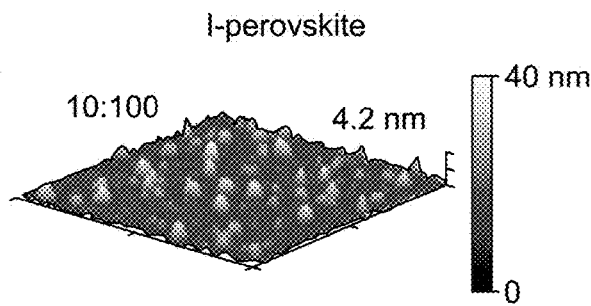
Figure 3C:
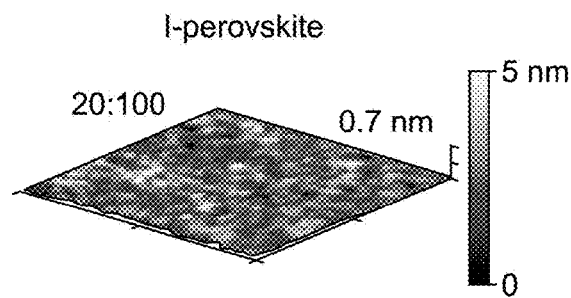
Figure 3D:
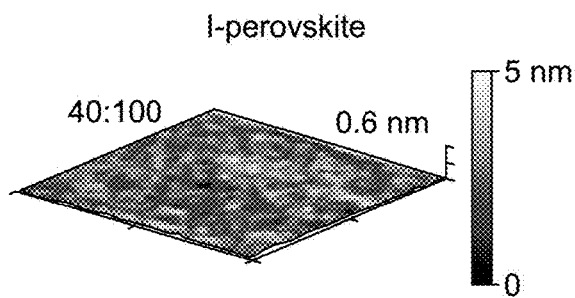
Figure 3E:
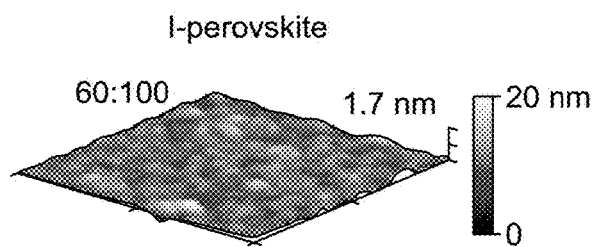
Figure 3F:
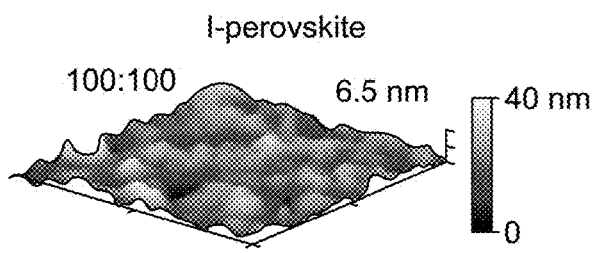
Figure 3G:
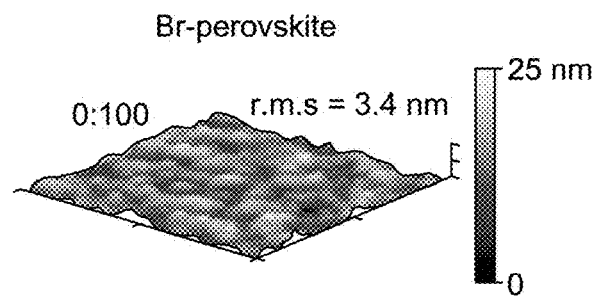
FIGS. 3g-3l are atomic force microscopy images of Br-perovskite films having varying molar ratios of n-butylammonium ligand according to some embodiments.
Figure 3H:
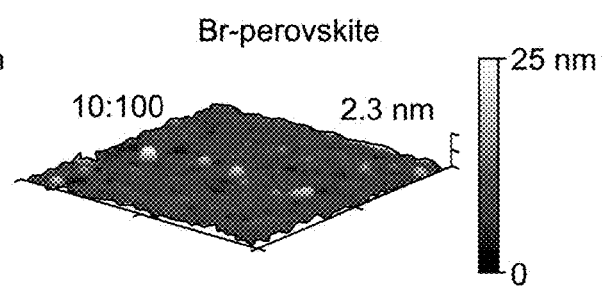
Figure 3I:
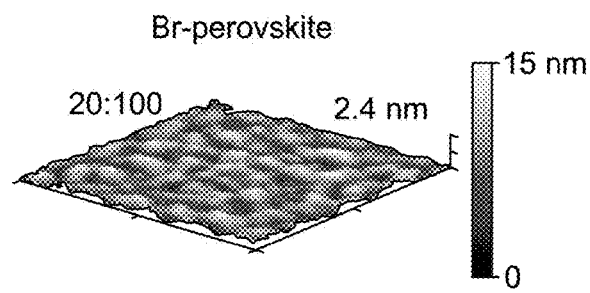
Figure 3J:
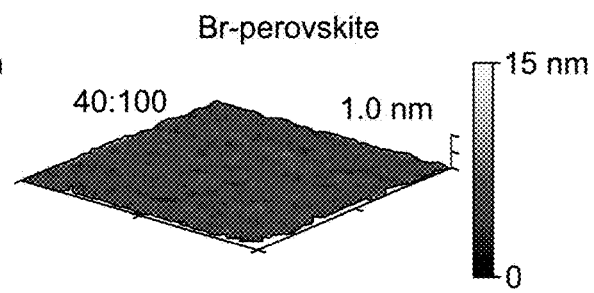
Figure 3K:
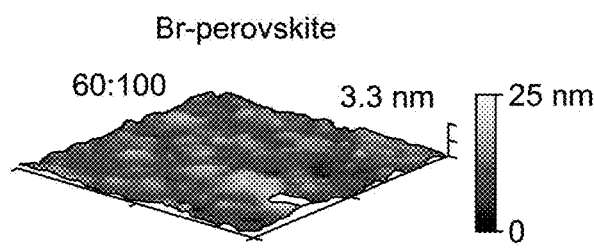
Figure 3L:
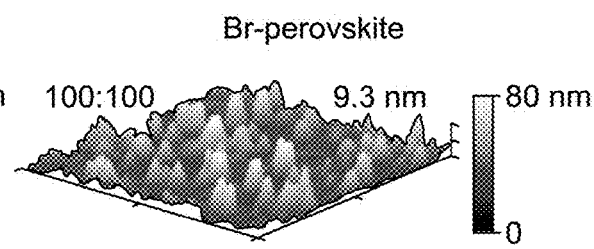

Organic-Inorganic Perovskite Films and Light Emitting Diodes Incorporating the Same As described in this example, the addition of long-chain ammonium halides (e.g. n-butylammonium halides (BAX, X=I, Br)) in the 3D perovskite precursor solution impedes the growth of the 3D perovskite grains and dramatically decreases the film roughness to 1 nm. The nanometer-sized grains feature reduced dimensionality, starting a transition from 3D to layered perovskite structures, manifesting in stronger and blue-shifted photoluminescence (PL) and electroluminescence (EL) compared to the emission from 3D perovskite. As detailed in this example, the EQE of iodide-perovskite (I-perovskite, BAI:MAPbI$_3$) LEDs increases from 1.0% to 10.4% due to the incorporation of BAI. Similarly, the EQE of bromide perovskite (Br-perovskite, BABr:MAPbBr$_3$) LEDs increases from 0.03% to 9.3% following the incorporation of BABr. The power efficiency (PE) and current efficiency (CE) reach 13.0 lm/W and 17.1 cd/A, respectively, for Br-perovskite LEDs. Furthermore, the shelf stability of unencapsulated I-perovskite and Br-perovskite LEDs in N$_2$ is dramatically improved after adding long-chain halides. Specifically, LEDs without BAX degrade to 60-70% of their initial value within two days whereas LEDs with BAX (X=I, Br) show no degradation after storage in the glove box for more than four months To deposit uniform pin-hole free perovskite films with small grain size, toluene was dropped on the spinning film at an appropriate time to extract the processing solvent (dimethylformamide or DMF), and thus halt the morphological evolution and maintain small crystallite size. To ensure consistency with the device structure, the optical, morphological, and structural properties of I-perovskite and Br-perovskite films were probed on poly[N,N'-bis(4-butylphenyl)-N,N'-bis(phenyl)-benzidine] (poly-TPD) and poly(N-vinylcarbazole) (PVK), respectively. It was found that the optimized timing for toluene application is 5 s for MAPbI$_3$ films spinning at 6,000 rpm from a solution concentration of 0.43 M. Because MAPbBr$_3$ exhibits more rapid crystallization than MAPbI$_3$, the optimized toluene dousing time is 4 s for films spinning at 4,500 rpm from a solution concentration of 0.3 M. The perovskite thickness is approximately 100 nm for I-perovskite films and 70 nm for Br-perovskite films. Atomic force microscope (AFM) images of MAPbI$_3$ (FIG. 3a) and MAPbBr$_3$ (FIG. 3g) films without annealing on poly-TPD and PVK substrates show that both are very uniform. The root mean square (rms) roughness is 4.9 nm for the MAPbI$_3$ film and 3.4 nm for the MAPbBr$_3$, respectively, which are among the most flat and uniform perovskite films reported.

Long-chain ammonium ions cannot fill in the corner of PbX$_4$ (X=I, Br, Cl) octahedral layers and therefore induce the formation of layered perovskites. Notably, when BAX (X=I, Br) is added into the MAPbX$_3$ precursor solution, the growth of the 3D perovskite grains during the film formation process is dramatically impeded. It is shown that, for BAI:MAPbI$_3$ molar ratios≤40:100 for I-perovskite films, and BABr:MAPbBr$_3$ molar ratios≤20:100 for Br-perovskite films, XRD patterns do not exhibit any changes in peak position, whereas layered perovskite phases nucleate when the molar ratio of BAX:MAPbX$_3$ is larger, as will be shown below. FIGS. 3b-f and FIGS. 3h-l show AFM images of I-perovskite and Br-perovskite films prepared from different molar ratios of BAI:MAPbI$_3$ and BABr:MAPbBr$_3$ in the precursor solution, respectively. As shown in FIG. 3, when the molar ratio of BAX:MAPbX$_3$ (X=I, Br) increases to 10:100, films feature smaller grain size and therefore reduced roughness. As the BAX concentration increases, grain size continues to decrease and films become smoother, decreasing to 0.6 nm RMS for I-perovskite film and 1.0 nm RMS for Br-perovskite film, respectively, for a molar ratio of BAX:MAPbX$_3$ (X=I, Br) of 40:100. In fact, the morphologies of these films are reminiscent of solution processed polymers, where grain sizes are too small to be resolved by the AFM tip. When the BAX:MAPbX$_3$ molar ratio is increased to larger than 60:100, larger grains start to form with the roughness of the film simultaneously increasing, which is shown to be due to the formation of layered perovskite phases.

Figure 3M:
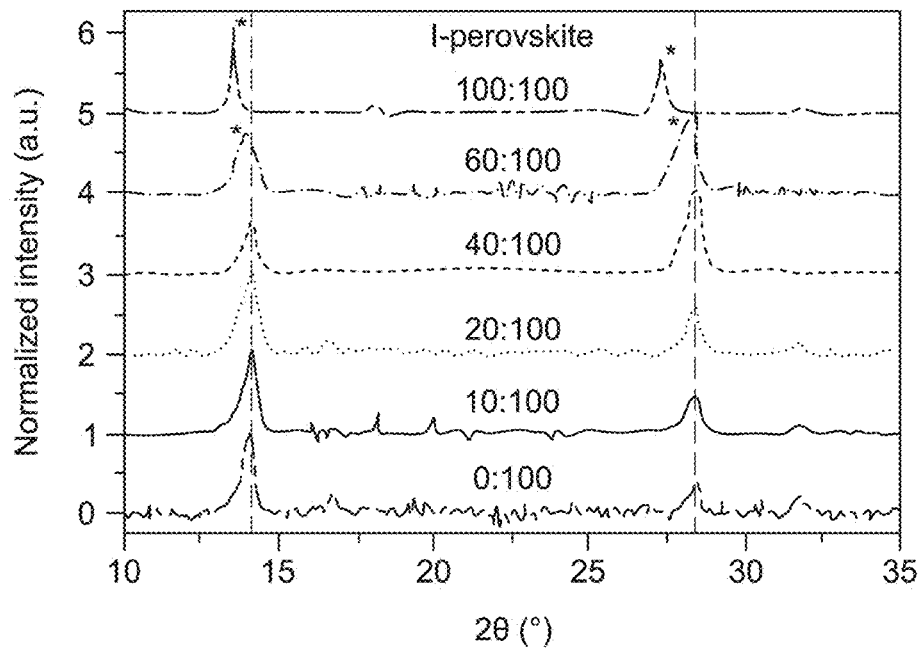
FIGS. 3m and 3n are X-ray diffractograms of I-perovskite and Br-perovskite films at varying ratios of n-butylammonium ligand according to some embodiments.
Figure 3N:
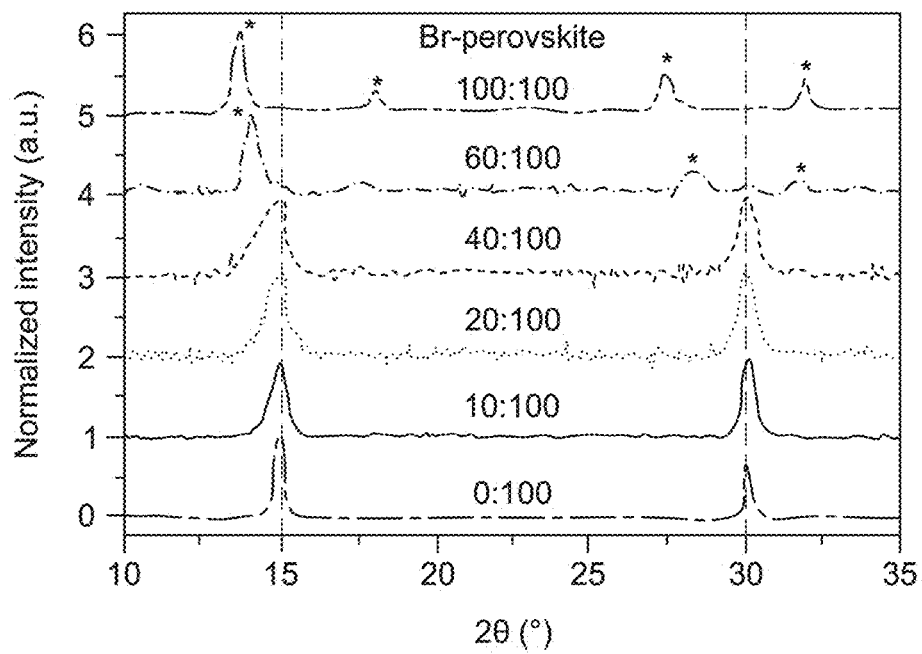

X-ray diffraction (XRD) was conducted on both I-perovskite and Br-perovskite films to determine the composition and crystallinity of the films. As shown in FIGS. 3m and 3n, no diffraction peaks corresponding to layered perovskite grains are observed when the BAX molar ratio is smaller than 40:100 for I-perovskite and 20:100 for Br-perovskite films, indicating that the as-formed films are composed of grains that are nearly indistinguishable from the 3D perovskite crystal structure with BA cations self-assembled at the grain surfaces. A representative schematic of the perovskite nano-crystallite covered with BAX is shown in FIG. 1. It also should be noted that the full width at half maximum (FWHM) of the diffraction peaks after adding BAX increases, indicating that crystallite size decreases. The crystallite size of MAPbI$_3$ calculated from the XRD data applying a Scherrer analysis is 16 and 13 nm, respectively, when the BAI:MAPbI$_3$ ratio is increased from 10:100 to 20:100, which is approximately 25 and 20 PbI$_4$ layers (considering the lattice constants of a=b=8.86 Å, c=12.65 Å for the tetragonal structure). Similarly, the crystallite size of the MAPbBr$_3$ is calculated to be 16 and 11 nm for BABr:MAPbBr$_3$ loadings of 10:100 to 20:100, which is approximately 27 and 19 PbX$_4$ layers (considering the lattice constants of cubic MAPbBr3: a=b=c=5.9 Å).

Therefore the crystallite of MAPbX$_3$ with BAX self-assembled at the surface can also be considered within the unit cell of layered BA$_2$MA$_{n-1}$PbnX$_{3n+1}$ perovskite phases where n equals the number of PbX$_4$ octahedral layers in the crystallite. The discrepancy between the n values calculated above and the n values expected from the BAX and MAX molar ratios in the precursor solution may result from the different reaction speed between MAX and BAX with PbX$_2$ (X=I, Br). Herein, the term "3D perovskite crystallites" is used in the discussion of the abovementioned films for simplicity, even though it is recognized that these particles possess reduced dimensionality from n=∞. Interestingly, the intensity of the higher order diffraction peaks (40:100 for I-perovskite; 10:100 and 20:100 for Br-perovskite) grow larger than the first order reflections. It is speculated that this is due to a superlattice effect where different superlattice layers are composed of grains of different dimensionality (i.e. a grain stack of n=5, n=10, and n=15 crystallites). For loadings beyond these threshold values, BAX is no longer playing the role of surfactant and crystallite terminator, but rather participates in crystallization. When this transition occurs, grain size begins to increase again and films become rougher. For instance when the molar ratio is further increased to 60:100 for BAI:MAPbI$_3$ or 40:100 for BABr:MAPbBr$_3$, layered perovskite diffraction peaks starts to appear. Ultimately, when the BAX ratio reaches 100:100, films become dominated by layered perovskite grains, which resemble the BA$_2$MA$_{n-1}$PbnX$_{3n+1}$ perovskite, with n=2.

Figure 4A:
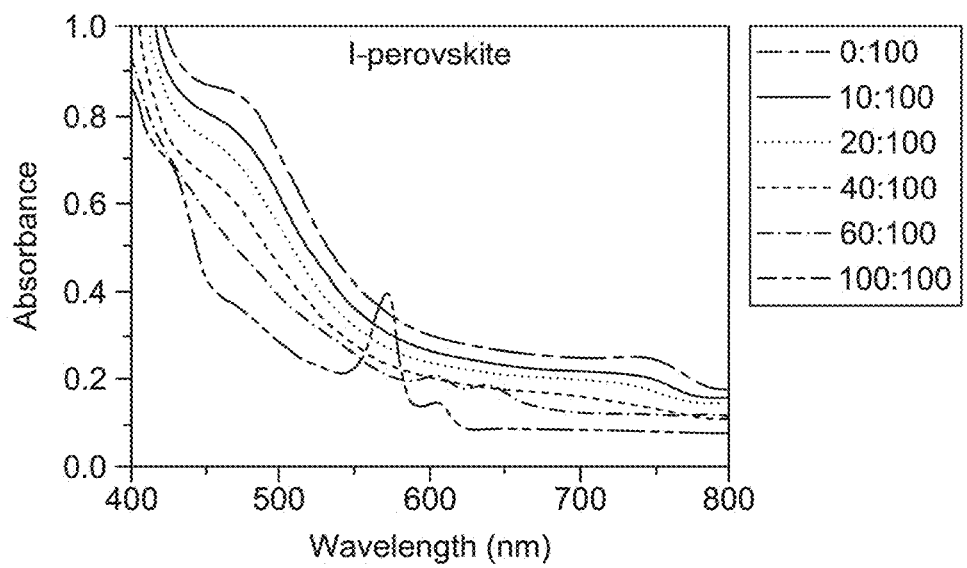
FIGS. 4a-4b illustrate absorption spectra of I-perovskite and Br-perovskite films respectively according to some embodiments.
Figure 4B:
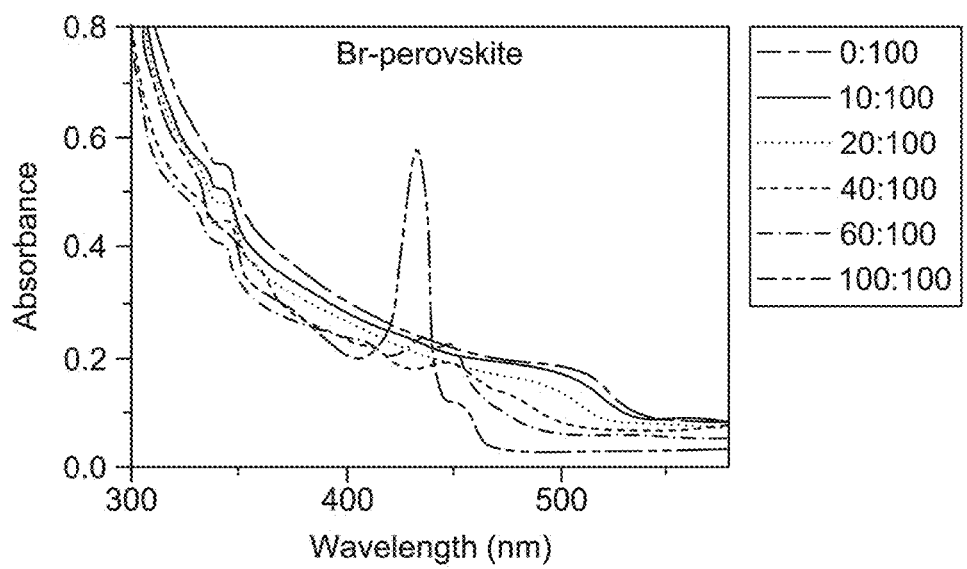
Figure 4C:
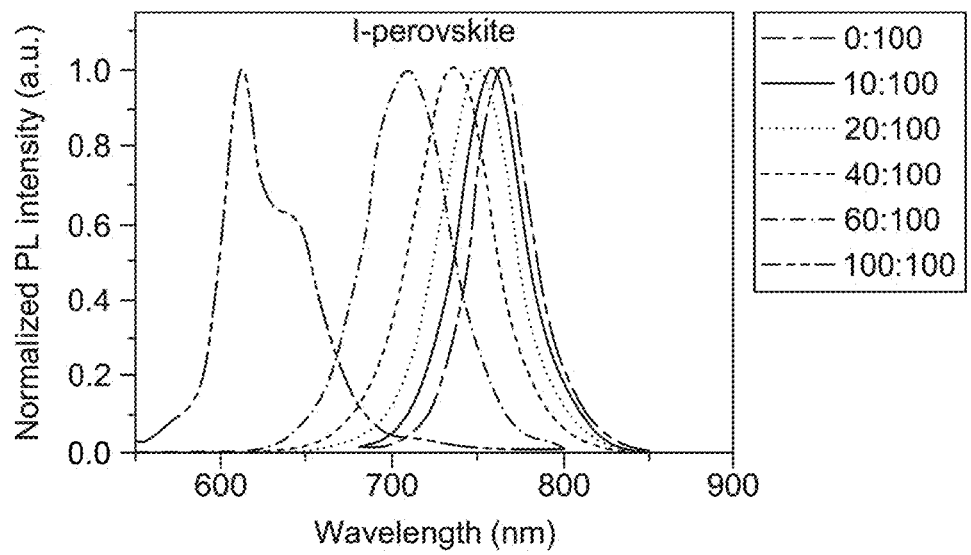
FIGS. 4c-4d illustrate photoluminescence (PL) spectra of I-perovskite and Br-perovskite films respectively according to some embodiments.
Figure 4D:
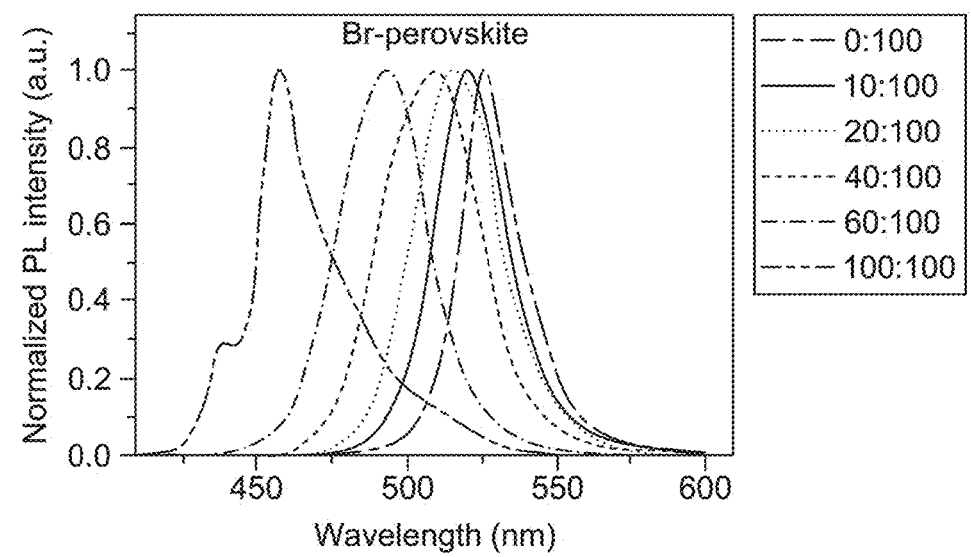
Figure 5A:
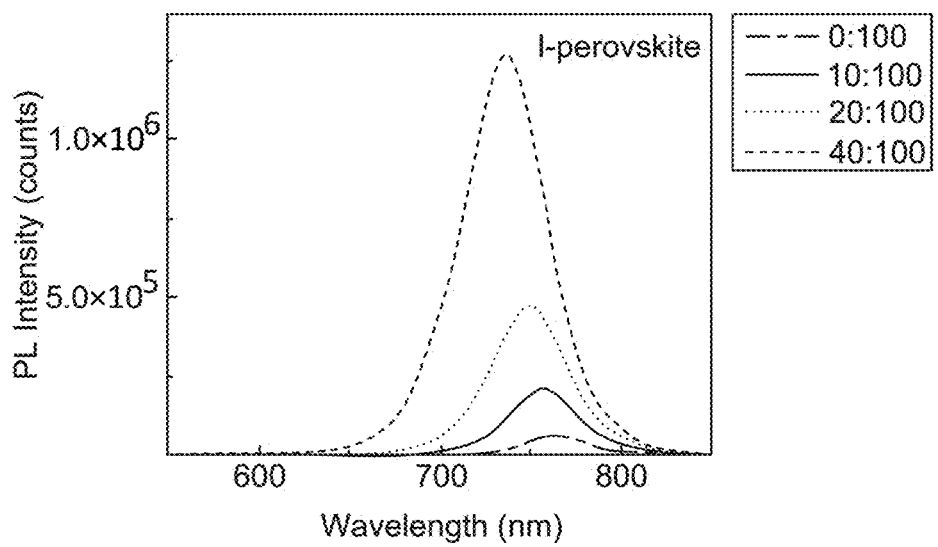
FIGS. 5a-5b illustrate increases in PL intensity of I-perovskite and Br-perovskite respectively with increasing molar ratios of n-butylammonium ligand according to some embodiments.
Figure 5B:
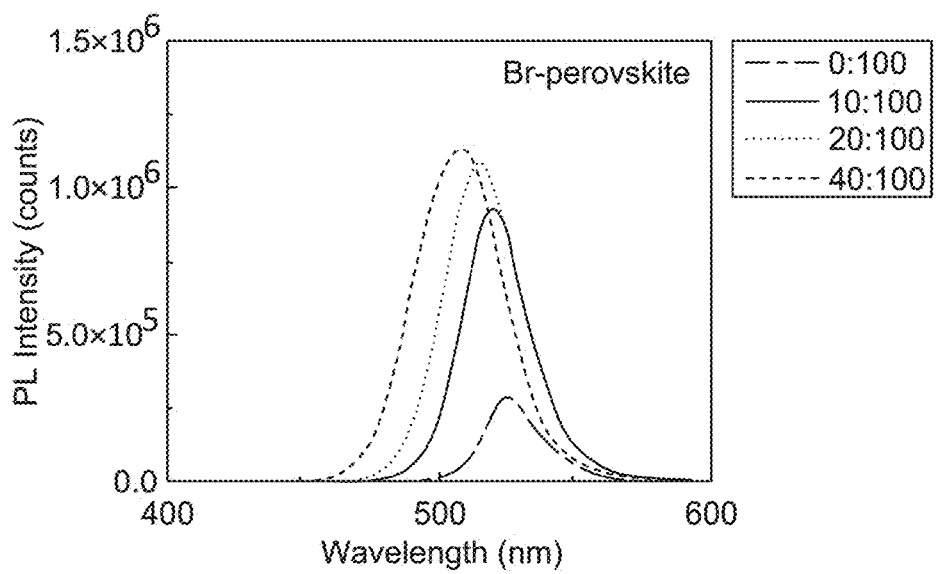

The absorption and photoluminescence (PL) spectra of I-perovskite and Br-perovskite films with different molar ratios of BAX:MAPbX$_3$ (X=I, Br) in the precursor solution are shown in FIGS. 4a-b and FIGS. 4c-d. With increased loading of BAX, the absorption edge blue shifts, and excitonic absorption peaks corresponding to layered perovskite grains start to emerge when the BAX ratio is increased to 60:100 for I-perovskite or 40:100 for Br-perovskite, respectively, in line with our observations from XRD as discussed above. In turn, the PL peaks of BAI:MAPbI$_3$ films gradually blue shift from 763 to 737 nm with increasing BAI content from 0:100 to 40:100, and the PL intensity concomitantly increases as illustrated in FIG. 5a. Similarly, the PL peaks of BABr:MAPbBr$_3$ films gradually blue shift from 526 to 509 nm with increasing BABr from 0:100 to 40:100, and the PL intensity also concomitantly increases as illustrated in FIG. 5b. The increased and blue-shifted PL emission is due to the reduced 3D perovskite crystallite dimensionality to n<30 surrounded by BA cations, inducing a disorder effect when the lattice periodicity is interrupted. When the BAX (X=I, Br) ratio is further increased to 60:100, layered perovskite grains with excitonic absorption form, inducing significant blue-shifts of absorption and PL, as shown in FIGS. 4b and 4d.

The energetic blue-shift with reduction in crystallite size is also suggested by the evolution of the absorption and PL spectra due to thermal annealing. Thermal annealing drives grain growth and increases grain size as confirmed by both AFM and XRD for both I-perovskite and Br-perovskite films. The full width half maximum (FWHM) of the (110) and (220) diffraction peaks for I-perovskite and (100) and (200) diffraction peaks for Br-perovskite become smaller after thermal annealing for various molar ratios of BAX:MAPbX$_3$ in the precursor solution. For the films annealed at 100° C. without BAX, the absorption edge at 770 nm for MAPbI$_3$ and 526 nm for MAPbBr$_3$ are emphasized and an excitonic absorption peak appears after annealing for MAPbBr$_3$ film, a result of Ostwald ripening. Grain growth of larger, more stable crystallites occurs at the expense of smaller grains. When the grains decrease below a certain size, the properties become more excitonic. In contrast, the PL peak position are unaffected by annealing.

This is because the crystallite size of approximately 25-30 nm (from XRD) is apparently already larger than the size below which substantial changes in PL are observed. When considering the impact of annealing on films processed with BAX, however, the changes are considerably different. For films with BAX (X=I,Br) molar ratio from 10:100 to 20:100, annealing causes the absorption edge and PL to red-shift toward those of the bulk 3D perovskite formed without BAX incorporation. For BAX loadings beyond 40:100, absorption peaks corresponding to both layered perovskite and 3D perovskite coexist in the films. The PL emission is dominated by the bulk 3D perovskite grains which may be due to charge migration from the larger bandgap layered perovskite grains to the smaller bandgap 3D perovskite grains. When the BAX ratio increases to 100:100, the I-perovskite can form stable layered perovskite films after thermal annealing, whereas 3D perovskite grains persist in the Br-perovskite films, evidenced from the PL beyond 500 nm.

Organic-Inorganic Perovskite LEDs

Figure 6A:
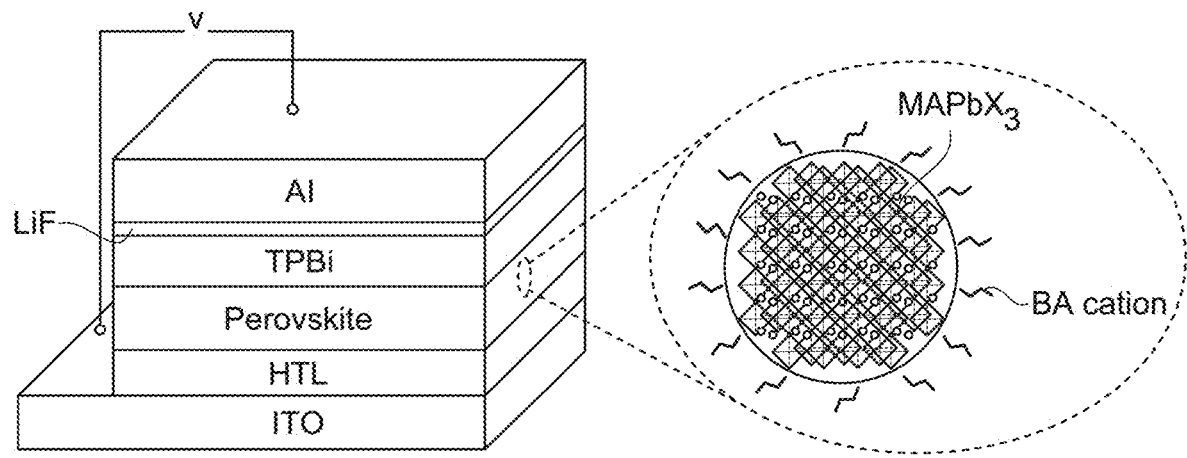
FIG. 6a illustrates a schematic of a organic-inorganic perovskite LED according to some embodiments.
Figure 6B:
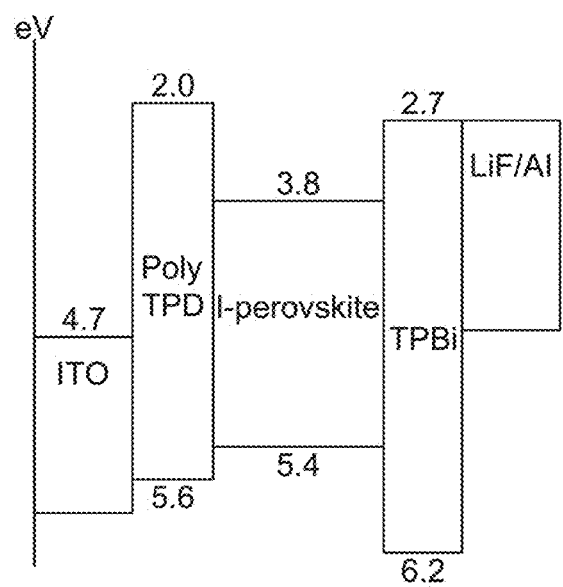
FIGS. 6b and 6c illustrate energy level diagrams for I-perovskite and Br-perovskite LEDs respectively according to some embodiments.
Figure 6C:
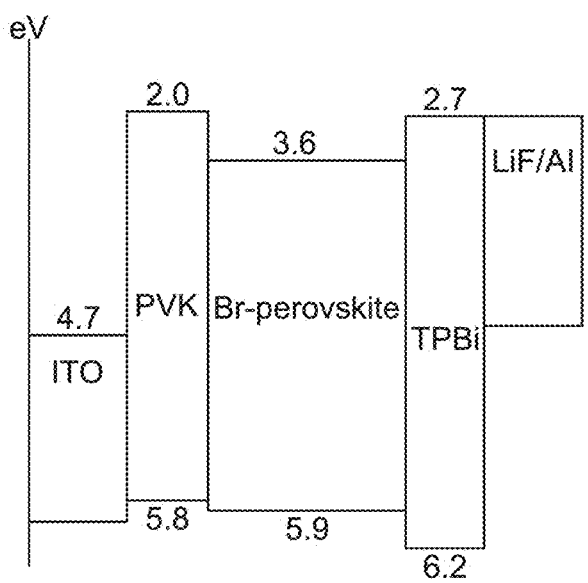

The device structures utilized for perovskite LEDs are: ITO (150 nm)/HTL (30 nm)/Iperovskite (100 nm) (or Br-perovskite, 70 nm)/TPBi(60 nm)/LiF(1.2 nm)/Al(100 nm) (ITO: indium tin oxide; HTL: hole transporting layer; TPBi: 2,2',2"-(1,3,5-benzinetriyl)-tris(1-phenyl-1-H-benzimidazole)). The device structure is shown schematically in FIG. 6a, along with energy diagrams in FIGS. 6b and 6c. The HTL utilized for I-perovskite based LEDs was poly-TPD with a highest occupied molecular orbital (HOMO) of 5.6 eV whereas PVK with a deeper HOMO level of 5.8 eV was used for Br-perovskite-based LEDs owing to better energy level alignment for hole injection and electron blocking. The TPBi layer serves as an electron injection and hole blocking layer for both I-perovskite and Br-perovskite LEDs. It should be noted that the energy levels of the perovskites may change as a result of the BAX incorporation. However, this change is expected to be relatively small (approximately 60 meV for I-perovskite and 80 meV for Br perovskite calculated from the PL peak shift) such that it has a minimal effect on charge injection and blocking.

Figure 7A:
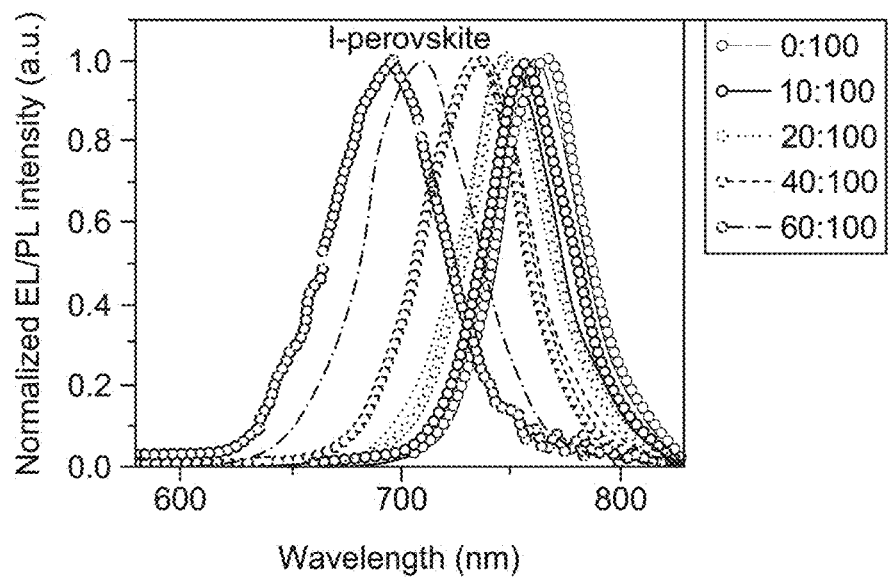
FIGS. 7a-7c illustrate I-perovskite normalized electroluminescence (EL) spectra, density-voltage-luminance (J-V-L) curves and external quantum efficiency (EQE) respectively as a function of n-butylammonium molar ratio according to some embodiments.
Figure 7B:
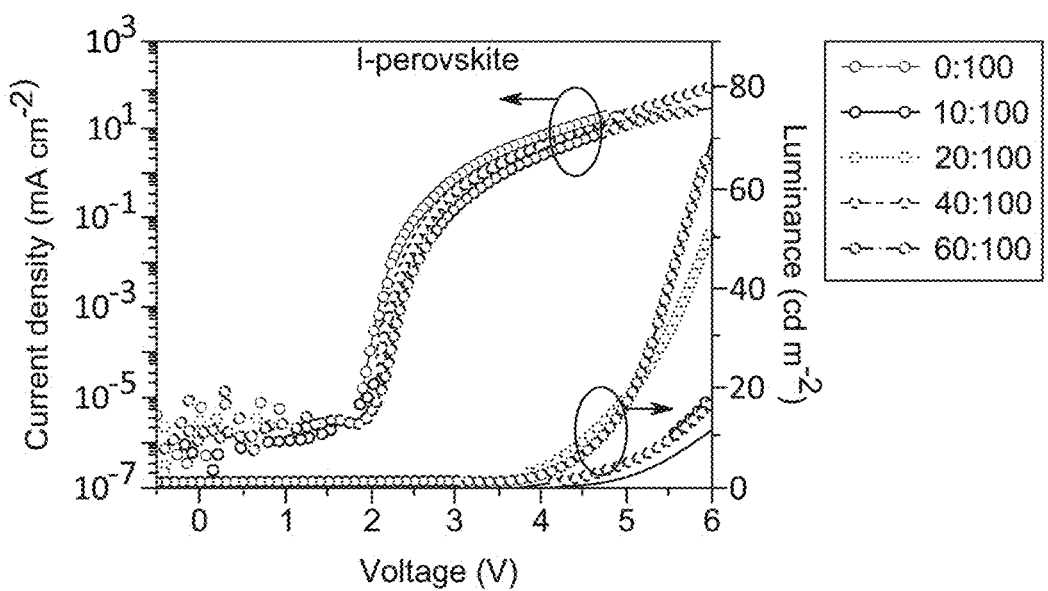
Figure 7C:
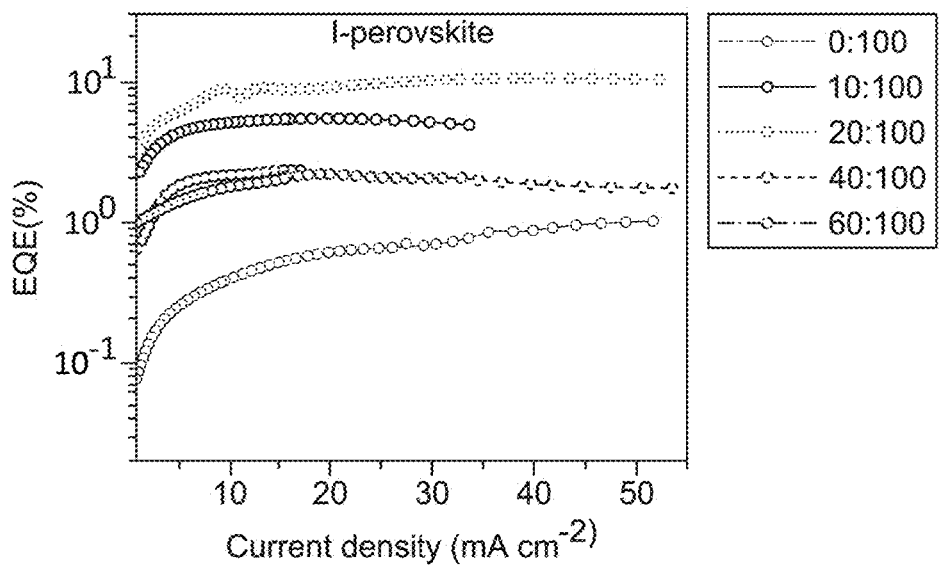
Figure 7D:
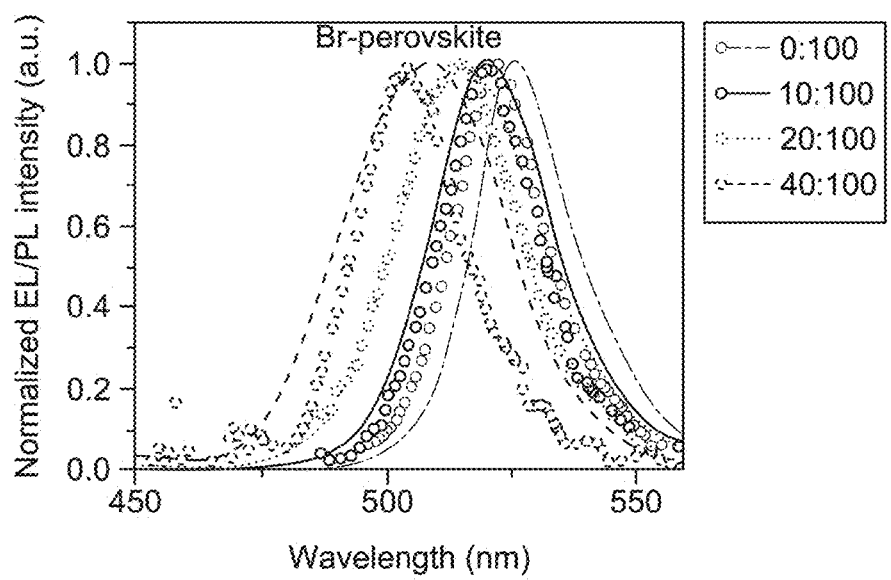
FIGS. 7d-7f illustrate Br-perovskite normalized EL spectra, density-voltage-luminance (J-V-L) curves and EQE respectively as a function of n-butylammonium molar ratio according to some embodiments.
Figure 7E:
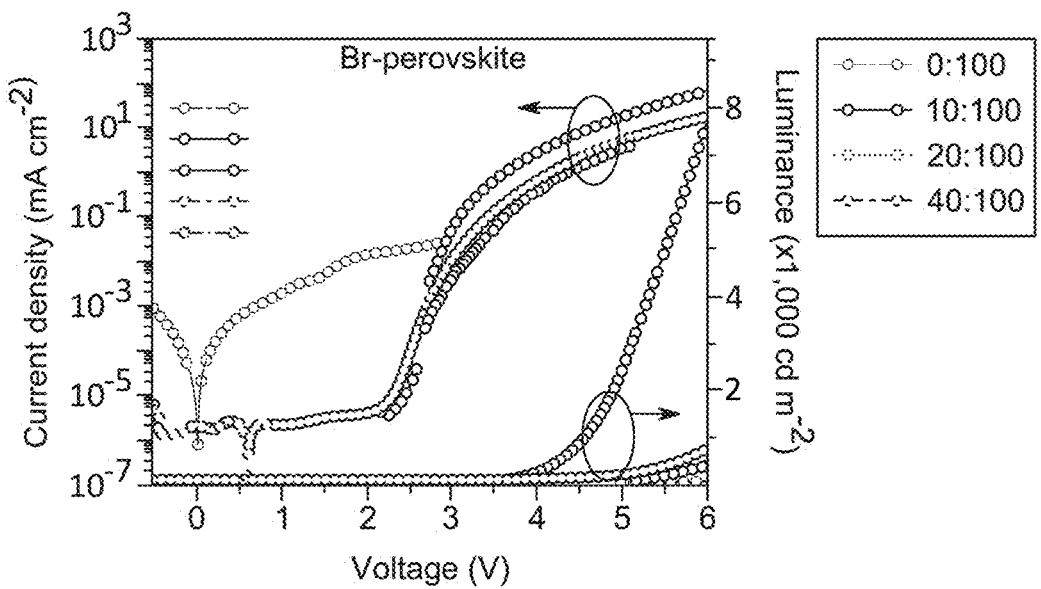
Figure 7F:
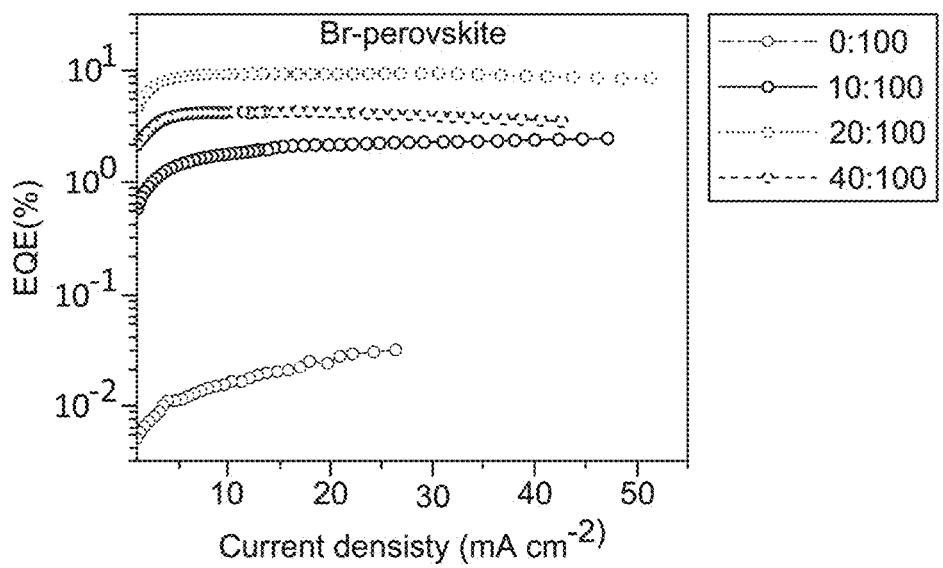

FIGS. 7a and 7d show the normalized EL spectra of I-perovskite and Br-perovskite LEDs, respectively. Similar to the PL, EL is blue-shifted with increasing molar ratio of BAX:MAPbX$_3$ (X=I, Br). The small blue-shift of EL peak position compared with PL (solid lines) for a few devices may result from a distribution of crystallite sizes and corresponding distribution of n values, with the smaller crystallites the more easily electrically populated and emissive. The EL of I-perovskite LEDs with molar ratio of 100:100 and Br-perovskite LEDs with molar ratio of 60:100 and 100:100 are too weak to be measured, possibly the result of the increasing population of layered perovskite phases which have been reported to have strong electron-phonon coupling that inhibits efficient EL. The current density-voltage-luminance (J-V-L) curves of I-perovskite and Br-perovskite LEDs and corresponding EQE curves are shown in FIGS. 7b and 7c and FIGS. 7e and 7f, respectively. All devices were scanned from negative bias to positive bias with a scanning rate of 0.1 V/s. The luminance and EQE of LEDs without the addition of BAX are low, likely a result of larger grain size and consequently reduced electron-hole capture rate. With increasing molar ratio of BAX:MAPbX$_3$ to 20:100 in the precursor, both the luminance and EQE of the device dramatically increase. It should be noted that the I-perovskite LEDs with BAI:MAPbI$_3$ molar ratio of 60:100 have higher luminance than the device with molar ratio of 20:100 due to the shifted spectrum that has moved more into the response curve of the eye. The highest EQEs reach 10.4% for 20:100 I-perovskite and 9.3% for 20:100 Br-perovskite LEDs, respectively.

Notably, the EQE of the perovskite LEDs are relatively flat over the range of the measurement, in contrast to recent work showing that EQE can increase substantially with current density. It is believed this to be primarily due to the low leakage currents in devices presented in this Example, at approximately $10^{-6}$ mA/cm$^2$, indicating very few parasitic leakage pathways exist between electrodes. It also indicates that, even at low current density, non-radiative recombination is slower than radiative bimolecular recombination. The peak PE and CE for Br-perovskite LEDs reach 13.0 lm/W at 1,200 cd/m$^2$ and 17.1 cd/A at 2,900 cd/m$^2$, respectively, while PE and CE of the I-perovskite devices are relatively low due to the near infrared light emission. For either the I-perovskite or Br-perovskite LEDs, when the BAX ratio goes beyond 40:100, the device performance decreases. Detailed performance metrics of both I-perovskite and Br-perovskite devices are provided in Table V.

TABLE V

Perovskite LED Performance Metrics

| Peak PL position (nm) | Peak EL position (nm) | Maximum Efficiency | | |
|---|---|---|---|---|
| | | PE (lm/W) | EQE (%) | CE (cd/A) |
| BAI:MAPbI$_3$ | | | | |
| 0:100  763 | 763 | 0.013 | 1.0 | 0.023 |
| 10:100  757 | 756 | 0.056 | 5.2 | 0.057 |
| 20:100  750 | 748 | 0.082 | 10.4 | 0.094 |
| 40:100  737 | 732 | 0.028 | 2.4 | 0.030 |
| 60:100  708 | 695 | 0.152 | 2.1 | 0.210 |
| BABr:MAPbBr$_3$ | | | | |
| 0:100  526 | 522 | 0.04 | 0.03 | 0.07 |
| 10:100  520 | 519 | 4.27 | 2.35 | 4.87 |
| 20:100  516 | 513 | 12.46 | 9.3 | 17.13 |
| 40:100  509 | 503 | 3.22 | 4.3 | 4.47 |

It has been reported that excess MABr in MAPbBr$_3$ can reduce the content of metallic lead and increase EQE of MAPbBr$_3$ based LEDs. As a comparison, I- and Br-perovskite LEDs were fabricated with MAX:MAPbX$_3$ (X=I, Br) molar ratio of 5:100 and 20:100 (MAX:PbX$_2$ molar ratio of 105:100 and 120:100). The excess MAX also effectively increases EQE for both I-perovskite and Br-perovskite LEDs. The EQE of I-perovskite LEDs increased from 1.0% to 2.4% and 3.6%, respectively, with the MAI:MAPbI$_3$ molar ratio increased from 0:100 to 5:100 and 20:100, and EQE of Br-perovskite LEDs increased from 0.02% to 0.8% and 2.1%, respectively, with the MABr:MAPbBr$_3$ molar ratio increased from 0:100 to 5:100 and 20:100. It was found that the incorporation of bulky ammonium halide ligands provide greater efficiency gains as compared to the addition of excess MAI because the ligands are effective in allowing for smaller grain size, and thin films with low roughness. It was noted that excess MAX can also effectively decrease crystallite size by forming many stacking faults within a grain. A high density of stacking faults can serve the same crystal termination effect as the long chain alkylammonium halides used herein, although less efficiently.

As further evidence of the versatility of this approach, another type of long-chain cation, phenylethylammonium iodide (PEAI), was incorporated with PEAI:MAPbI$_3$ molar ratio of 20:100. The highest EQE reaches 9.6% after the addition of PEAI in the MAPbI$_3$ precursor solution.

Hysteresis and Stability of Organic-Inorganic Perovskite LEDs

The photocurrent hysteresis of perovskite solar cells is thought to be due to both ion migration and traps, an aspect that complicates accurate efficiency measurement. Hysteresis has also been previously reported to exist in the J-V-L response of perovskite LEDs, and can lead to inaccurate performance characterization due to its influence on the steady state EL emission and angular profile measurements. And because ion migration primarily occurs along grain boundaries, the influence of the BAX additives to LED hysteresis has been investigated. By measuring the J-V-L characteristics with various scanning direction and rates, as shown in FIGS. 8a-8f, it can be seen that all devices show some level of hysteresis for both J and L. Nevertheless, the devices with BAX:MAPbX$_3$ (X=I, Br) molar ratio of 20:100 exhibit reduced hysteresis. It is believed that the long-chain BA cations that self-assemble at the crystallite surface either impede ion motion or prevent ions from within crystallites from participating in ion migration processes. In essence, the BA cation, being larger than MA, decreases the cation's thermodynamic activity or chemical potential at the surface (i.e. by reducing the equilibrium vapor pressure at the surface). In order to ensure that devices are able to provide reliable characterization, the steady state EQE was measured at a constant voltage of 5.0 V.

Figure 8A:
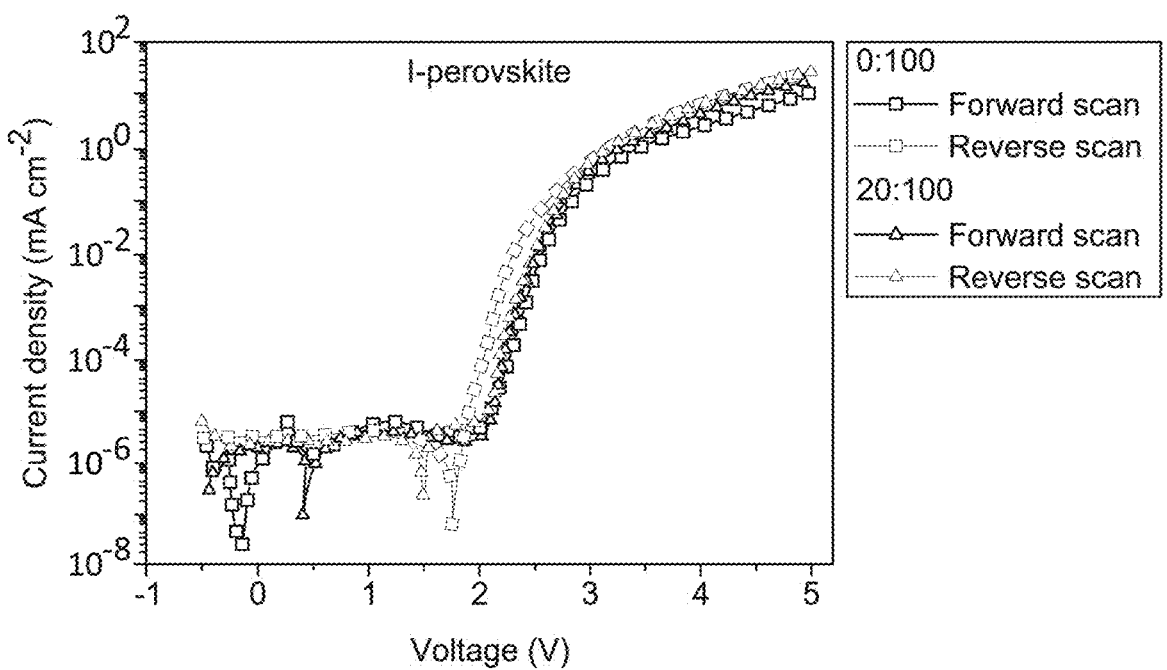
FIGS. 8a-8c illustrate current density, luminance and EQE respectively of I-perovskite LEDs with BAI:MAPbI$_3$ molar ratios of 0:100 and 20:100 according to some embodiments.
Figure 8B:
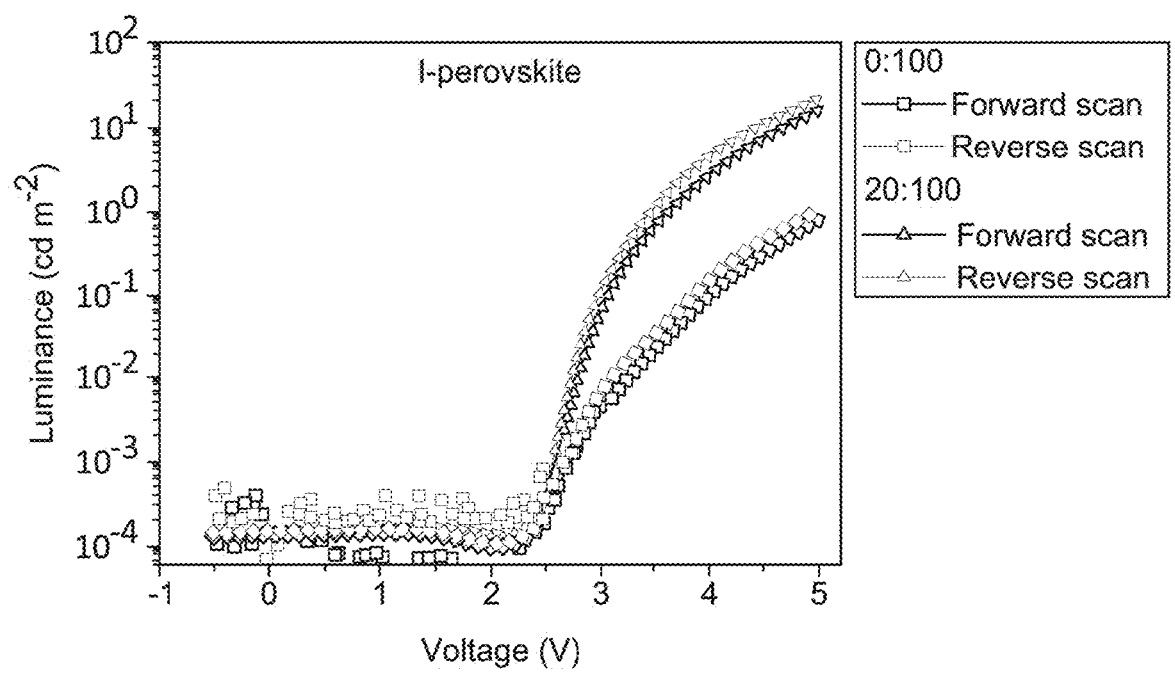
Figure 8C:
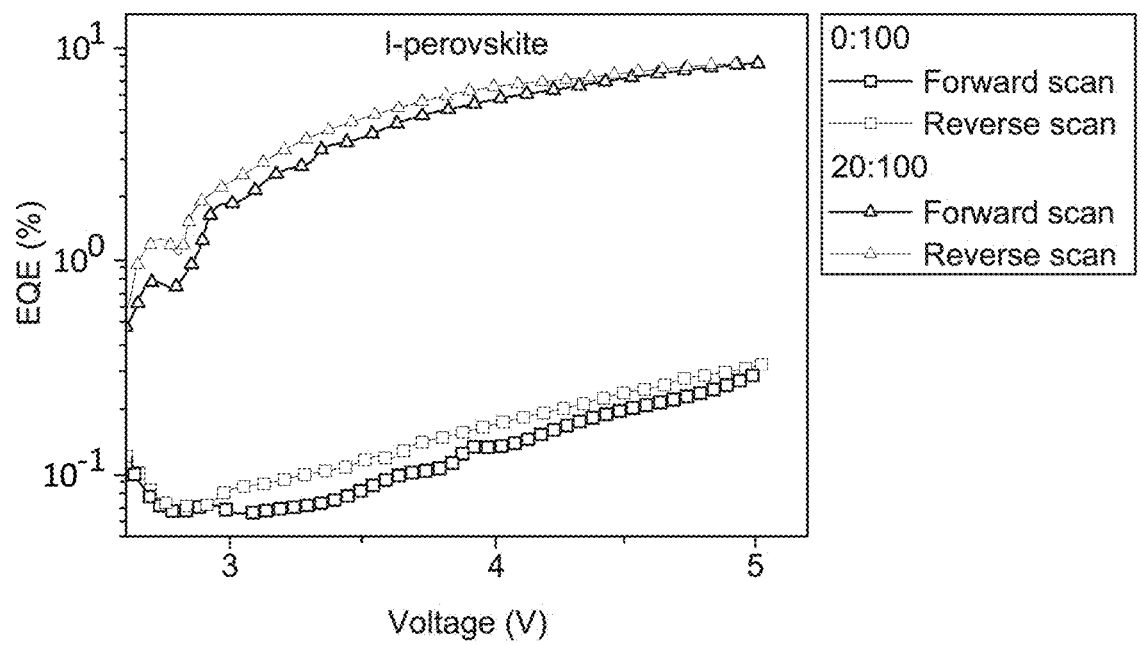
Figure 8D:
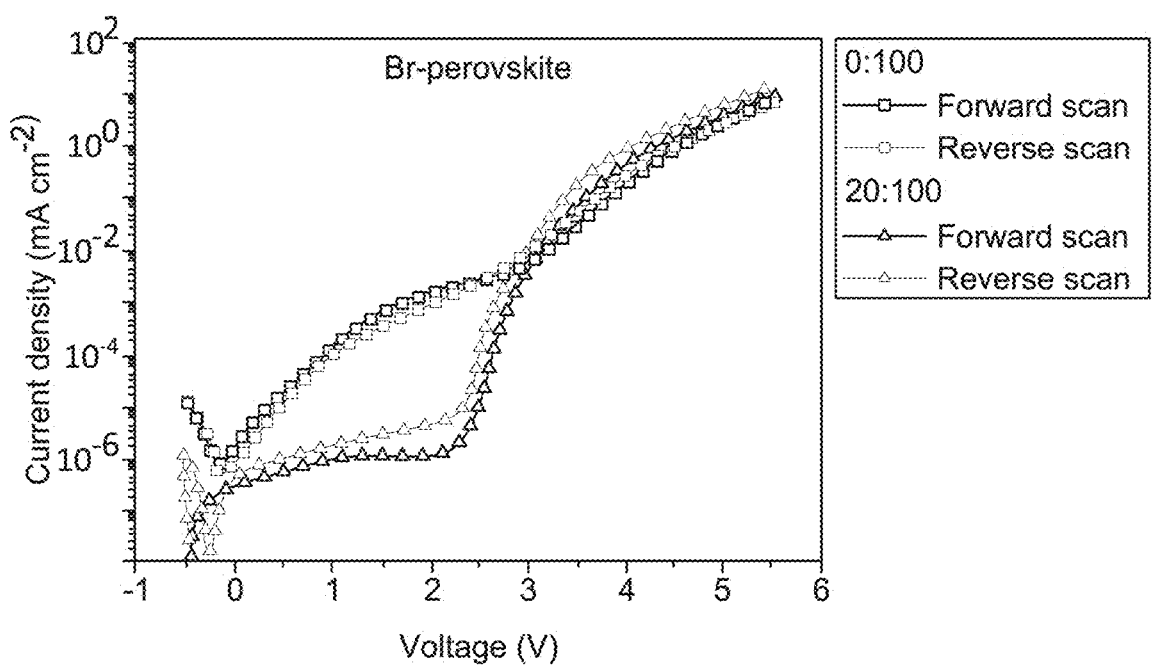
FIGS. 8d-8f illustrate current density, luminance and EQE respectively of I-perovskite LEDs with BABr:MAPbBr$_3$ molar ratios of 0:100 and 20:100 according to some embodiments.
Figure 8E:
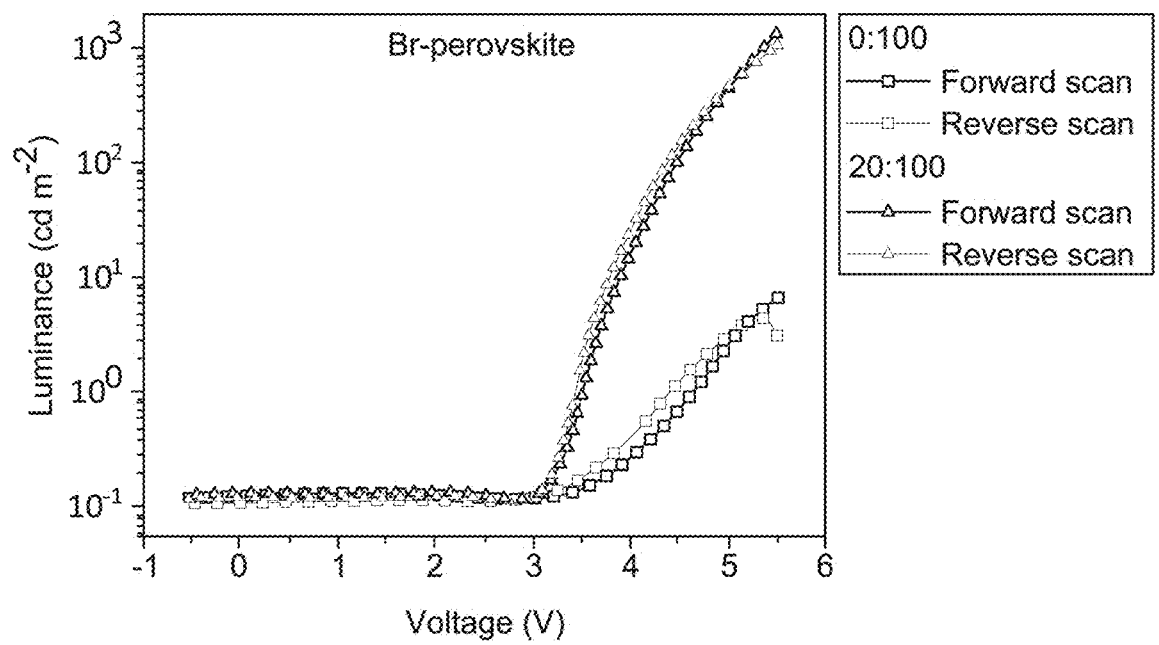
Figure 8F:
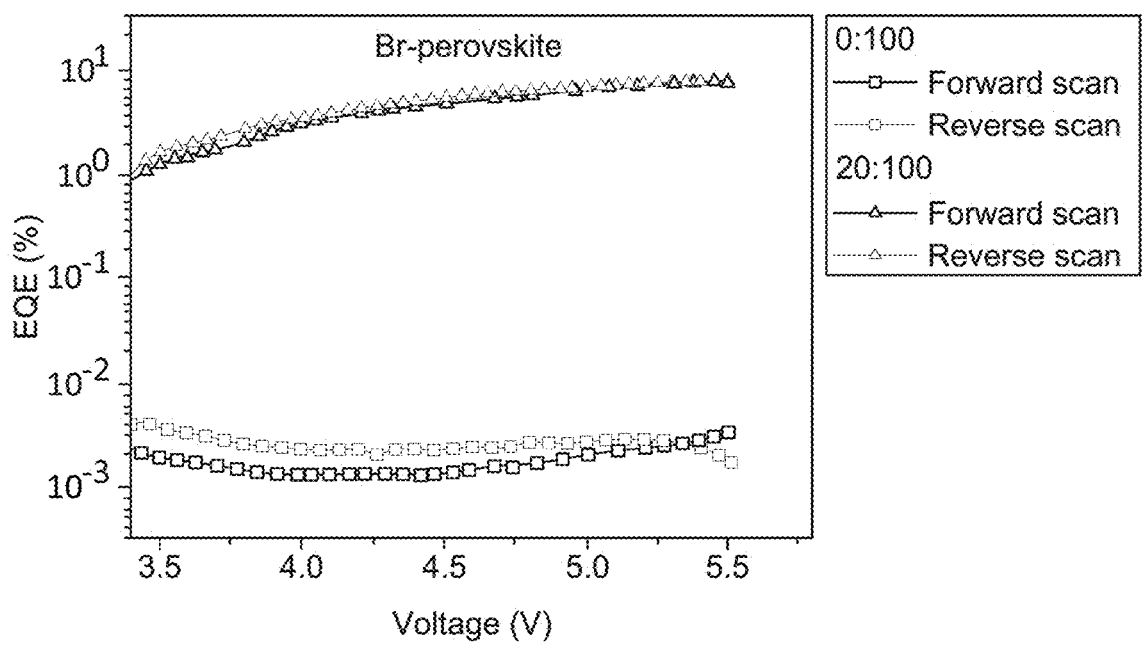
Figure 8G:
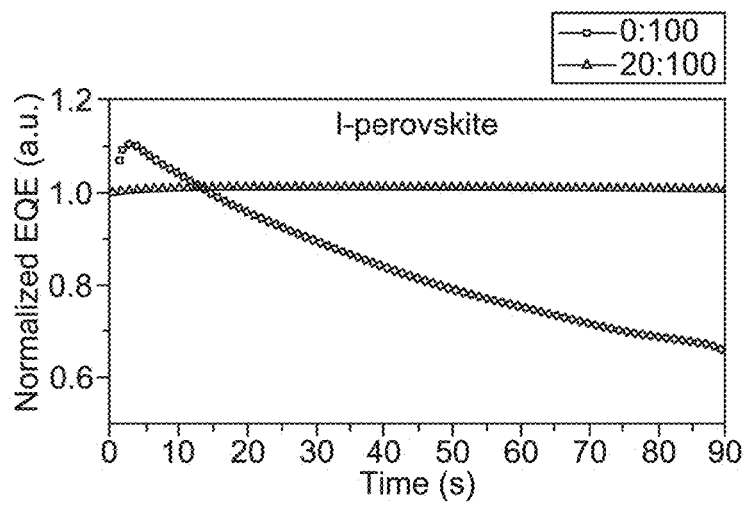
FIGS. 8g and 8h are steady state EQE measurements of I-perovskite and Br-peroskite LEDs respectively at constant voltage of 5.0V according to some embodiments.
Figure 8H:
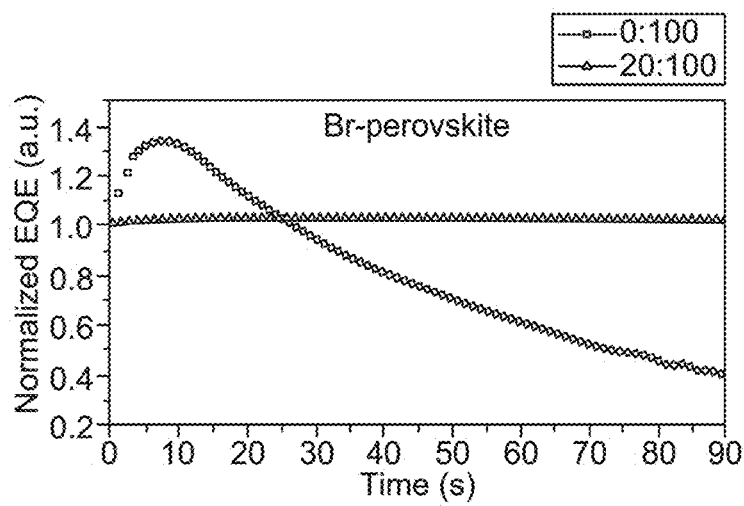
Figure 8I:
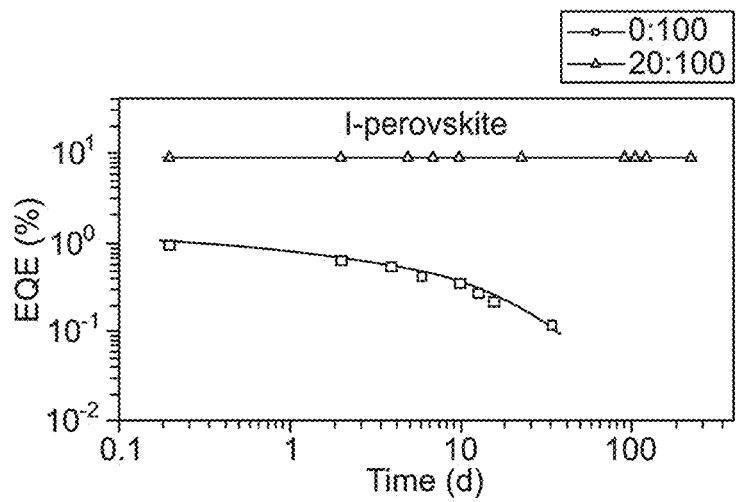
FIGS. 8i and 8j illustrate shelf stability of unencapsulated I-perovskite and Br-perovskite LEDs respectively as a function of storage time under N$_2$.
Figure 8J:
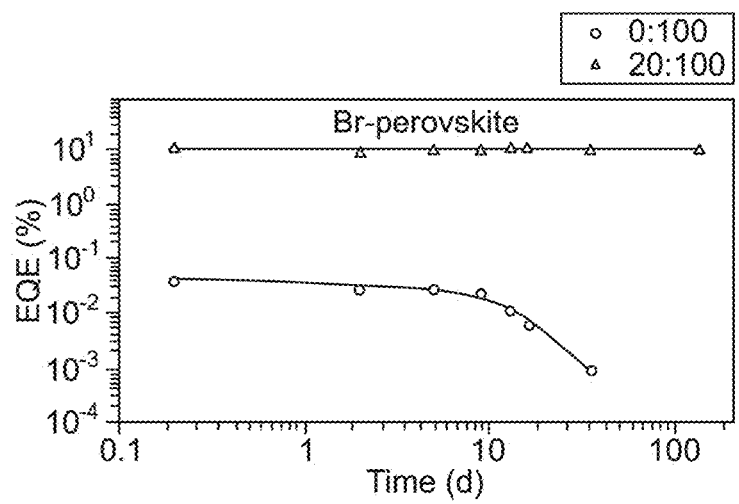

As shown in FIGS. 8g and 8h, the EQE of the device without BAX showed a strong poling effect, while the devices with BAX are relatively stable. The initial increase of the EQE might result from trap filing such that injected charges have a higher radiative recombination rate, while the decrease of the EQE after a few seconds might be due to ion-migration-induced degradation of the perovskite layer. Stability is of critical importance for perovskite LEDs, and thus the shelf stability of unencapsulated LEDs stored in N$_2$ were evaluated over time. The control devices without BAX in the precursor solution decrease to 60-70% of their initial value after two days, whereas the EQE of an I-perovskite LED with BAI:MAPbI$_3$ molar ratio of 20:100 is stable without degradation after storage for more than four months. Similarly, Br-perovskite LEDs also show no degradation after storage for at least five weeks. The improved stability of the perovskite LEDs with BAX can be attributed to the ultra-smooth, pinhole free, and compact perovskite films as well as the bulky nature of the long alkyl chains that stabilize the crystallite surfaces. The stabilized nano-crystallite perovskite films also enable improved operational stability, an aspect that is critical for display and lighting applications. Perovskite LEDs without BAX showed gradually decreasing EQE, while the devices with BAX are more stable. It is noteworthy that the I-perovskite LED with BAI:MAPbI$_3$ molar ratio of 20:100 only degraded by 10% after continued operation at a constant current density of 3 mA/cm² for 300 min, while the device without BAI degraded by 60% in 10 min.

Materials synthesis MAI, BAI and PEAI were synthesized by mixing methylamine, butylamine and phenylethylamine (Sigma Aldrich) with equimolar amounts of aqueous HI (Sigma Aldrich, stabilized) solutions together at 0° C. with constant stirring under nitrogen atmosphere. MABr and BABr were synthesized with the same procedure. The alkylammonium halides (MAI, BAI, PEAI, MABr and BABr) were washed with an ethanol:ether solvent mixture and rotovaped several times to remove the HI stabilizer.

Perovskite film deposition and characterization Poly-TPD (or PVK) was dissolved in chlorobenzene at a concentration of 6 mg/ml. Poly-TPD (or PVK) was spin coated on top of ITO substrate at a spin speed of 1,000 rpm for 60 s, followed by thermal annealing at 150° C. (or 120° C. for PVK) for 20 min. The poly-TPD layer was treated by $O_2$ plasma for 2 s to improve wetting. The $MAPbI_3$ or $MAPbBr_3$ precursors were dissolved in DMF (Sigma Aldrich, 99.8% anhydrous) at concentrations of 0.43 M and 0.3 M, respectively. Then, different molar amounts of BAI and BABr were added into the $MAPbI_3$ and $MAPbBr_3$ solutions, respectively, before spin coating. The spin coating rate for the I-perovskite was 6,000 rpm, and toluene was dropped on the spinning substrate at 5 s. The spin speed for the Br-perovskite was 4,500 rpm, and the toluene was dropped on the spinning substrate at 4 s. The AFM measurements were conducted in the tapping mode in a $N_2$ filled glove box (Veeco di Innova). XRD measurements were performed with a Bruker D8 Discover X-ray diffractometer with Bragg-Brentano parallel beam geometry, a diffracted beam monochromator, and a conventional Cu target X-ray tube set to 40 kV and 40 mA. Absorption spectra were measured using a Cary 5000 UV-Vis-NIR systems (Agilent). The PL spectra were measured using an FLS 980 spectrometer (Edinburgh Instruments) with an excitation wavelength of 380 nm.

Device fabrication and characterization All the perovskite films are dried at 70° C. for 5 min following spin coating to fully dry the film and ensure the full reaction of the precursors without affecting the morphology and grain size substantially. TPBi, LiF and Al layers were sequentially thermally deposited on top of the perovskite film to thicknesses of 60 nm, 1.2 nm and 100 nm respectively. The device area was 0.1 cm². The perovskite LED devices were measured in $N_2$ using a homemade motorized goniometer setup consisting of a Keithley 2400 sourcemeter unit, a calibrated Si photodiode (FDS-100-CAL, Thorlabs), a picoammeter (4140B, Agilent), and a calibrated fiber optic spectrophotometer (UVN-SR, StellarNet Inc.).

Example 2

Organic-Inorganic Perovskite Films and Light Emitting Diodes Incorporating the Same In this example, an in-situ strategy for the synthesis of metal halide perovskite nanocrystal thin films is provided. Rather than casting films from pre-prepared nanocrystal suspensions, in-situ growth of perovskite nanocrystals is promoted during the film formation process by incorporating bulky organoammonium halides as additives into the starting precursor solution, which act to confine the crystal growth of 3D perovskites and passivate the surface of perovskite nanocrystals, increasing time-resolved PL (TRPL) decay lifetime and quantum yield (QY) significantly. Using this strategy, highly efficient methylammonium lead iodide ($MAPbI_3$) and methylammonium lead bromide ($MAPbBr_3$) LEDs are demonstrated with peak external quantum efficiency (EQE) as high as 7.9% and 7.0%, respectively. These values represent a 40-fold and 23-fold improvement over control devices fabricated without the additives.

A one-step solvent exchange method is used to prepare $MAPbI_3$ perovskite films. Stoichiometric perovskite precursors were pre-mixed in dimethylformamide (DMF) and a solvent exchange step is performed during spin coating by dropping toluene onto the spinning sample, resulting in uniform perovskite films. The toluene extracts the DMF solvent and freezes the morphological evolution during crystallization. Although full coverage is achieved, the perovskite film is rough with grains ranging from 30 nm to 170 nm, and notably with a large volume of unpassivated grain boundaries. The root mean square (RMS) roughness is extracted to be 5.7 nm using an atomic force microscope (AFM).

Bulky organoammonium halides inhibit the growth of three-dimensional (3D) perovskites, resulting in layered Ruddlesden-Popper phases if the precursors satisfy the stoichiometry of that phase. In this example, stoichiometric 3D $MAPbI_3$ perovskite precursor solution was used with 20 mol % bulky 4-fluorophenylmethylammonium iodide (FPMAI) added as additives. Using the same film preparation method, the resulting perovskite films were ultrasmooth with only 1.2 nm RMS roughness. Furthermore, the grains become so small that they can no longer be properly resolved by AFM with a tip radius of ~20 nm, in agreement with Example 1 using butylammonium iodide as an additive. The motivation for the use of FPMAI in this example is the presence of fluorine provides a distinct chemical signature of the bulky additive.

X-ray diffraction (XRD) measurements show the same tetragonal perovskite crystal structure for samples with and without FPMAI additives, indicating that the FPMAI additives are not incorporated into the grains in a Ruddlesden-Popper phases, but rather allow the nanocrystals to retain at 3D $MAPbI_3$ perovskite structure. The full width at half maximum (FWHM) of the (110) peak at 14° is larger for samples with FPMAI additives, in agreement with the smaller crystal size seen in the AFM results. X-ray photoelectron spectroscopy (XPS) analysis was used to verify the presence of FPMAI additives in the film. A prominent F1s peak was observed for samples with FPMAI additives while no F1s peak is observed for samples without FPMAI additives, proving that the FPMAI additives are indeed incorporated within the film. Furthermore, both samples show the same Pb4f and I3d spectra, indicating identical oxidation states of $Pb^{2+}$ and $I^-$.

To further understand the morphology and composition of additive-induced ultrasmooth perovskite films, cross-sectional transmission electron microscopy (TEM) measurements of $MAPbI_3$ perovskite films with and without FPMAI were performed, as shown in FIG. 9. The view in FIG. 9a shows that, without the processing additive, the stoichiometric solution produces a compact polycrystalline film, featuring perovskite grains exhibiting various orientations. FIG. 9c shows a high-resolution TEM (HRTEM) image for a perovskite film without additives, with lattice fringes spaced by 0.32 nm. This fringe spacing corresponds to the (004) plane spacing for $MAPbI_3$ crystals. In contrast, $MAPbI_3$ perovskite films processed with FPMAI possess a "nanocrystal-in-matrix" morphology, as shown in FIG. 9b. The lattice fringes of one representative nanocrystal are shown in FIG. 9d, where the inter-plane spacing of 0.22 nm is indexed to the (224) plane of MAPbI$_3$. FIG. 9e shows the size distribution of MAPbI$_3$ perovskite nanocrystals. An average crystal size of 5.4 nm is achieved, with a standard deviation of 0.8 when fitting with a normal distribution. The crystal size distribution is narrower than that reported using other in situ fabrication techniques, although still broader than that of nanocrystals synthesized in solution, where narrow size distributions are achieved through centrifugation.

Figure 10:
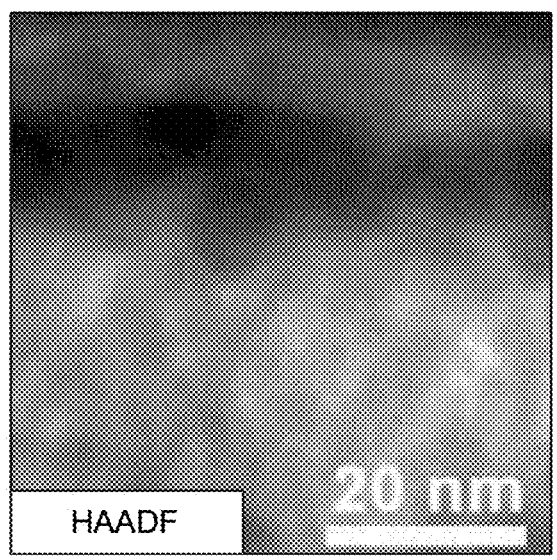
FIG. 10 is a cross-sectional scanning TEM image of an organic-inorganic perovskite layer without additives.
Figure 11:
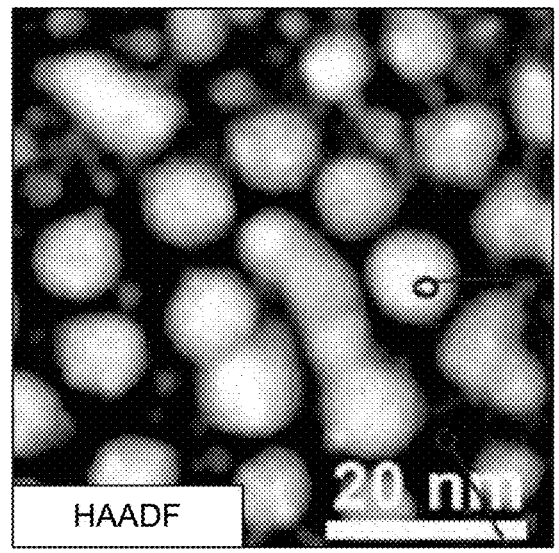
FIG. 11 is a cross-sectional scanning TEM image of an organic-inorganic perovskite layer with additives illustrating nanocrystal in matrix morphology.
Figure 12A:
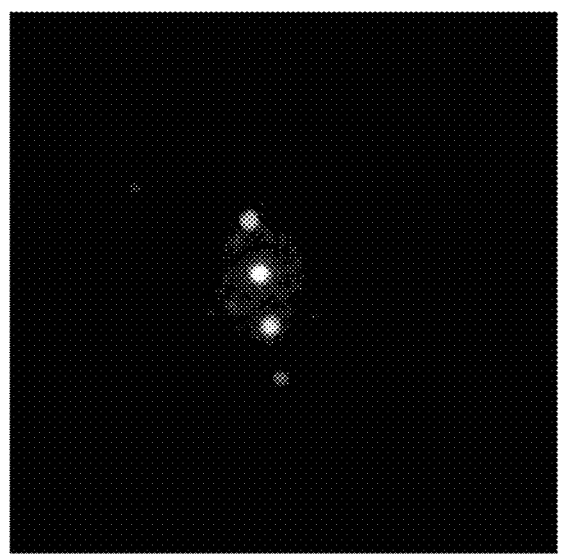
FIG. 12a is an electron diffraction pattern of MAPbI$_3$ nanocrystals of FIG. 11.
Figure 12B:
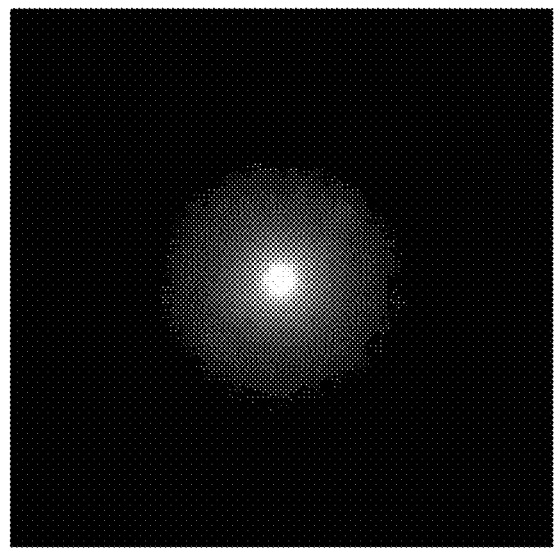
FIG. 12b is an electron diffraction pattern of matrix material surrounding the MAPbI$_3$ nanocrystals in FIG. 11.

To further investigate the morphology and distribution of MAPbI$_3$ perovskites throughout films, scanning transmission electron microscopy (STEM) and energy-dispersive X-ray spectroscopy (EDS) measurements were carried out for elemental mapping. The dense perovskite films formed without additives are further confirmed with the uniform distribution of Pb as shown in the STEM image of FIG. 10. In contrast, the distribution of Pb for MAPbI$_3$ perovskites formed using FPMAI additives is consistent with the nanocrystal distribution observed in the STEM image of FIG. 11, proving that MAPbI$_3$ perovskites are confined into nanocrystals embedded in the additive-formed matrix. The corresponding electron diffraction patterns of the MAPbI$_3$ nanocrystal and the matrix are shown in FIGS. 12a and 12b, respectively, showing that the MAPbI$_3$ nanocrystals are crystalline while the matrix is amorphous. The distribution of N and I is also consistent with the "nanocrystal-in-matrix" morphology while the distribution of C is not, and the signal of C is very strong in the matrix area. It is therefore believed the matrix is primarily composed of excess bulky ligands, rather than crystalline or amorphous MAPbI$_3$.

Based on observations regarding the different morphologies of perovskite films formed with and without additives, the following mechanism is proposed for the additive-confined perovskite crystallization process. Without additives, perovskite crystals grow from different nucleation sites and aggregate, forming compact polycrystalline perovskite films (confirmed by the TEM image in FIG. 9a) that possess a large volume of unpassivated grain boundaries. However, when bulky organoammonium halide additives are introduced in the processing, the outward growth of perovskite crystals from the initial nucleation sites is strongly suppressed. This results in sub-10 nm perovskite nanocrystals with additives capping the nanocrystal surface, forming a "nanocrystal-in-matrix" morphology as provided in FIG. 9b.

Based on this understanding of the mechanism of the additive-confined perovskite crystallization process, maintaining a stoichiometric ratio of the 3D MAPbI$_3$ precursors with a suitable amount (20 mol % in this work) of bulky organoammonium halide additives is key to the success of this in-situ nanocrystal preparation strategy. This was confirmed by XRD and TEM that, at this percentage of loading, the bulky additives do not incorporate into the 3D tetragonal MAPbI$_3$ perovskite structure, but only serve to confine the perovskite crystal growth. These observations indicate that the 3D tetragonal perovskite nucleates and grows prior to the lower dimensional Ruddlesden-Popper phase. However, at higher loadings of FPMAI additives (e.g., 40 mol % or 60 mol %), the structure of the resulting films shifts to that of the lower dimensional Ruddlesden-Popper phase. Additionally, adopting a solvent exchange technique during film processing is necessary because it freezes the subsequent morphological evolution during crystallization. It should be noted that, when precursor solutions with bulky organoammonium halides are prepared according to the stoichiometry of the layered Ruddlesden-Popper phase, the resulting perovskite films are compact polycrystalline films with the Ruddlesden-Popper phase structure, as opposed to the "nanocrystal-in-matrix" morphology, as confirmed using TEM in recent reports. In addition, when excess MAI is used in MAPbI$_3$ precursor solutions instead of a bulky organoammonium halide, the resulting perovskite films are still compact and polycrystalline with large grains, with MAI at crystallite surfaces or, owing to its high vapor pressure, ultimately exiting the film. The fact that the present technique of using bulky organoammonium halides additives results in "nanocrystal-in-matrix" morphology distinguishes this strategy from prior techniques.

Figure 9A:
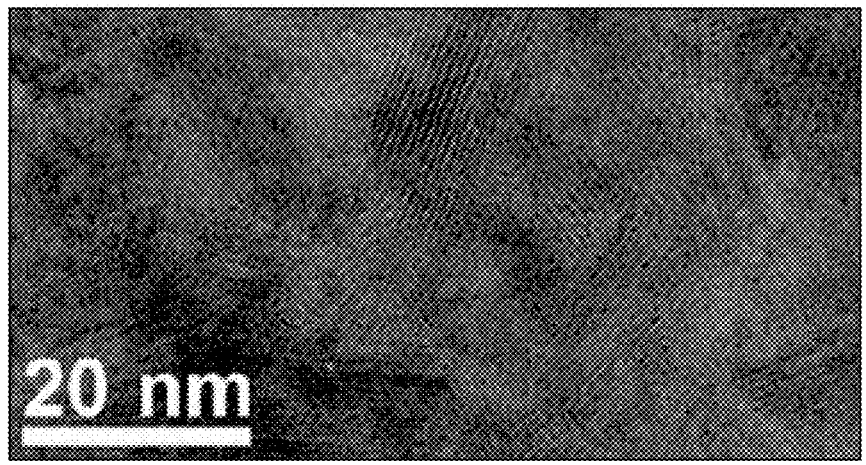
FIG. 9a is a cross-sectional transmission electron microscopy (TEM) image of a prior organic-inorganic perovskite layer without additives.
Figure 9B:
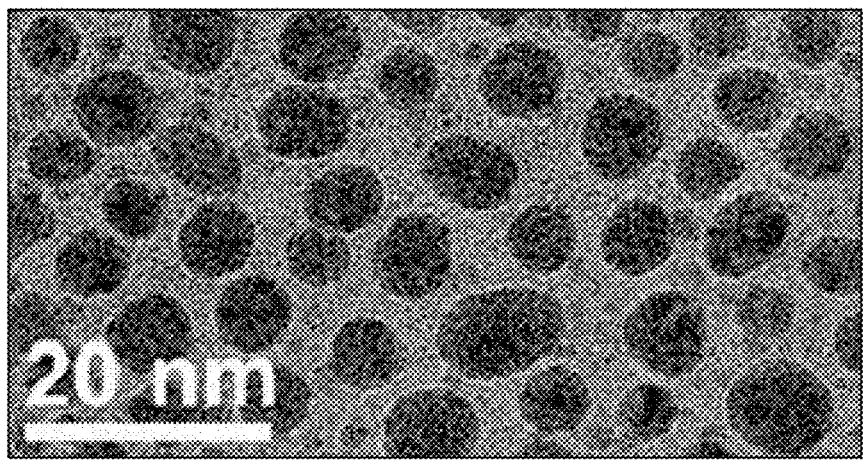
FIG. 9b is a cross-sectional TEM image of an organic-inorganic perovskite layer prepared according to methods described herein in some embodiments having a nanocrystal in matrix morphology.
Figure 9C:
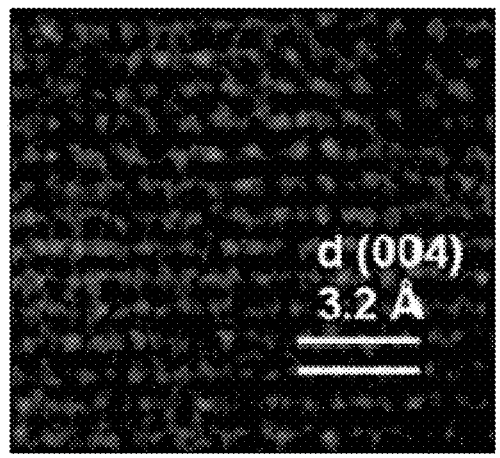
FIG. 9c is a high resolution TEM image of an organic-inorganic perovskite layer without additives.
Figure 9D:
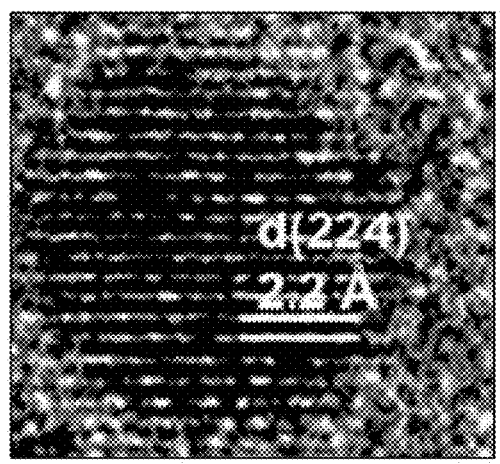
FIG. 9d is a high resolution TEM image for an organic-inorganic perovskite layer described herein with additives according to some embodiments.
Figure 9E:
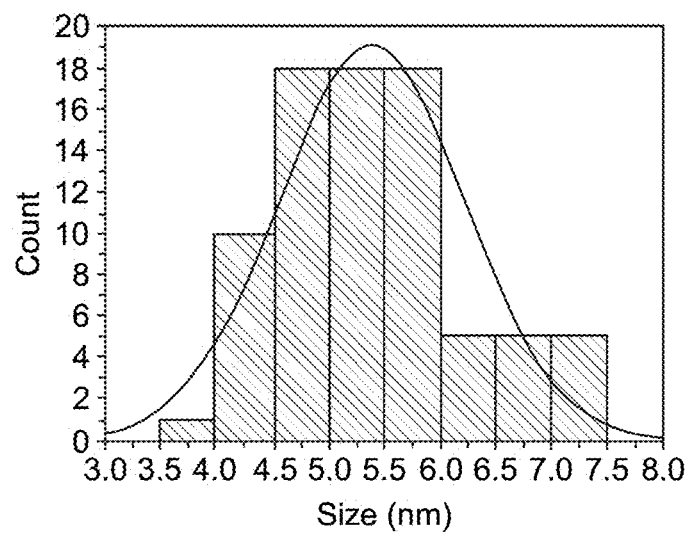
FIG. 9e is a histogram of organic-inorganic perovskite nanocrystals described herein with crystal size distribution determined using short diameter of each particle, with a normal distribution fit.
Figure 13A:
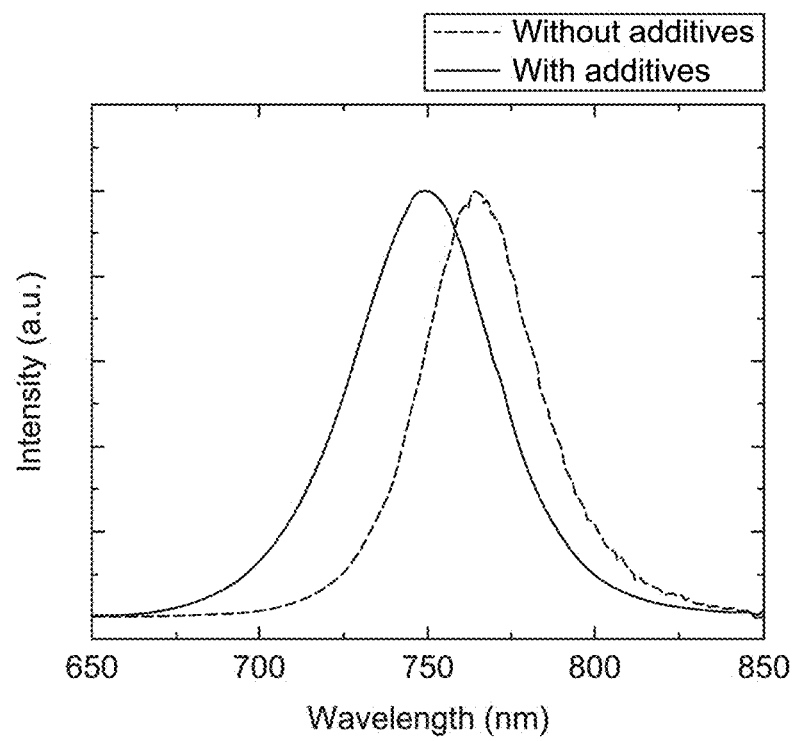
FIGS. 13a and 13b show the steady state PL spectra and TRPL data, respectively of organic-inorganic perovskite films with and without FPMAI additive according to some embodiments.
Figure 13B:
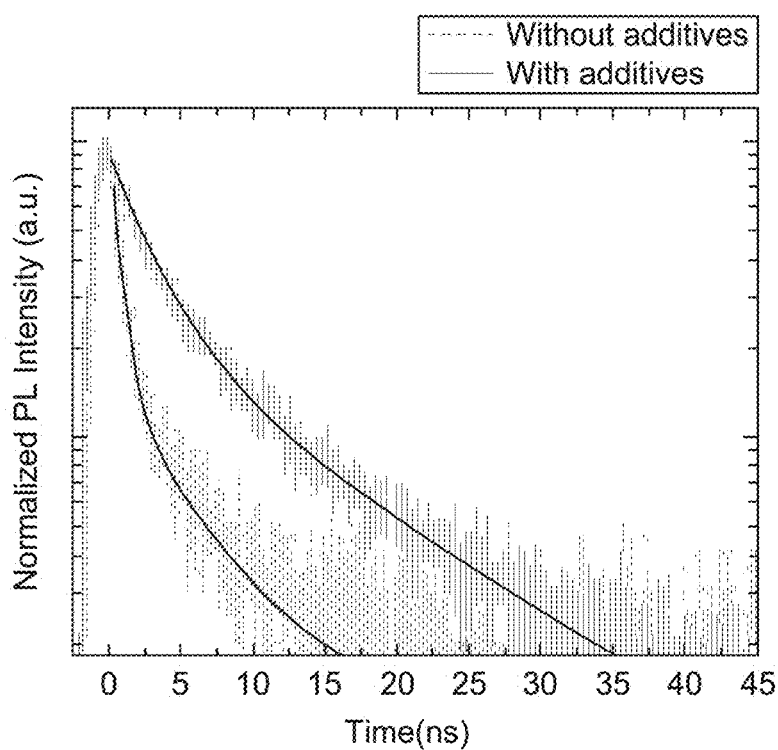

To investigate the effects of the present synthetic strategy on the optical properties of the perovskite films, the steady-state PL spectra, PLQY and TRPL of MAPbI$_3$ films with and without the FPMAI additives were characterized. FIGS. 13a and 13b show the steady state PL spectra and TRPL data, respectively. With FPMAI additives, the steady-state PL emission peak is blue-shifted from 764 nm to 749 nm. It is not a quantum confinement effect, since this would only manifest for nanocrystal diameters approaching the Bohr radius, approximately 2.1 nm. Instead, this can be understood as an effect of increased disorder. As shown in FIG. 9d, the sub-10 nm nanocrystals contain approximately 15 lattice plane spacings. While this size is not small enough to induce quantum confinement and a subsequent sensitive dependence of bandgap on size, the long-range, infinite lattice periodicity of a bulk material is nevertheless disturbed in the nanoscale system. Also, the dielectric constant of the local environment for these nanocrystals (which is the organic matrix) is substantially lower than the perovskite, thus further confining the wave-function to the crystallite. At an excitation intensity of 2 mW/cm$^2$, QY is increased from 0.1% to 4.4%, while the TRPL decay lifetime is increased from 3 to 9 ns for films processed with FPMAI additives, indicating that the FPMAI additives can passivate trap states and reduce non-radiative recombination. One likely channel for non-radiative recombination is quenching on under-coordinated Pb sites. It has been reported that excess MAI in MAPbI$_3$ can form a layer at grain boundaries, which can help suppress nonradiative recombination. Given the similar nature of excess MAI and FPMAI, we suspect that FPMAI passivates under-coordinated Pb atoms in a similar manner.

Figure 14A:
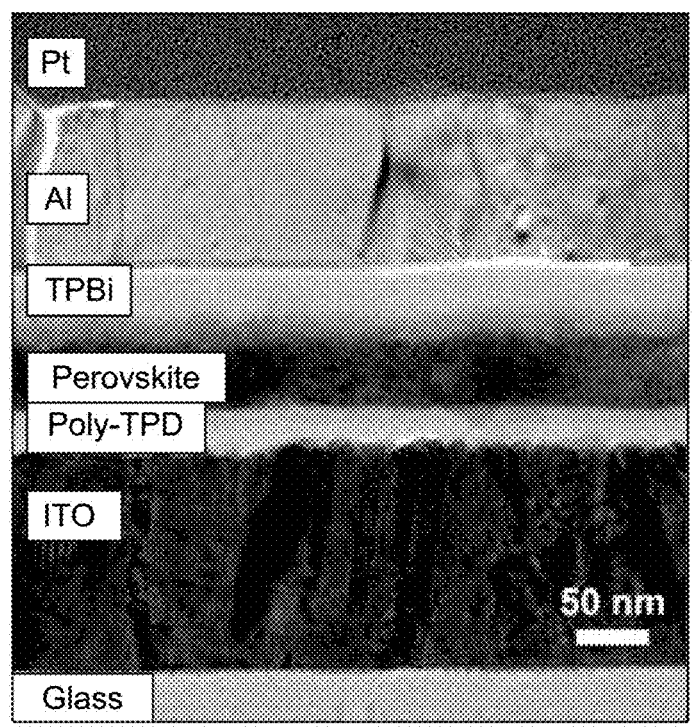
FIG. 14a is a cross-sectional TEM wherein the organic-inorganic perovskite layer of the LED does not include FPMAI additive.
Figure 14B:
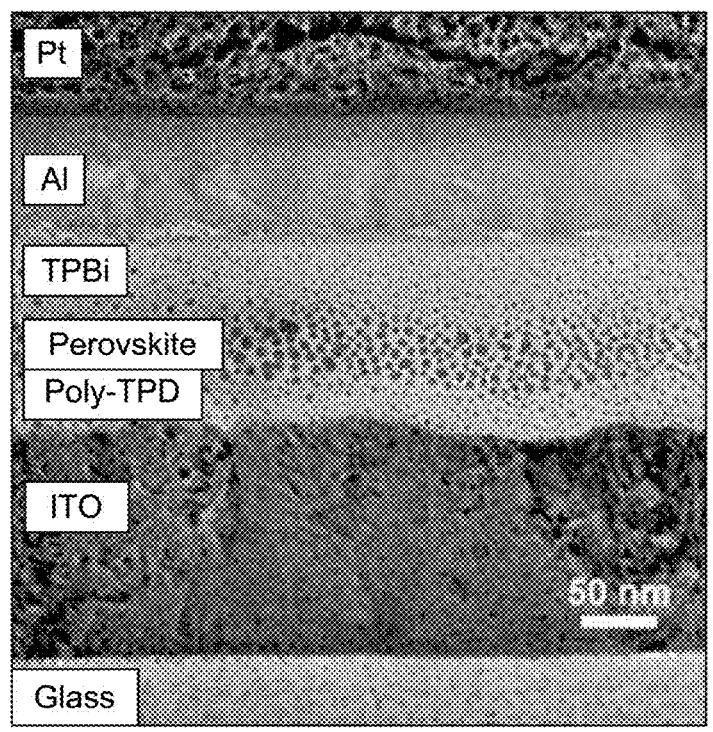
FIG. 14b is a cross-section TEM wherein the organic-inorganic perovskite layer of the LED includes FPMAI additive according to some embodiments.
Figure 15A:
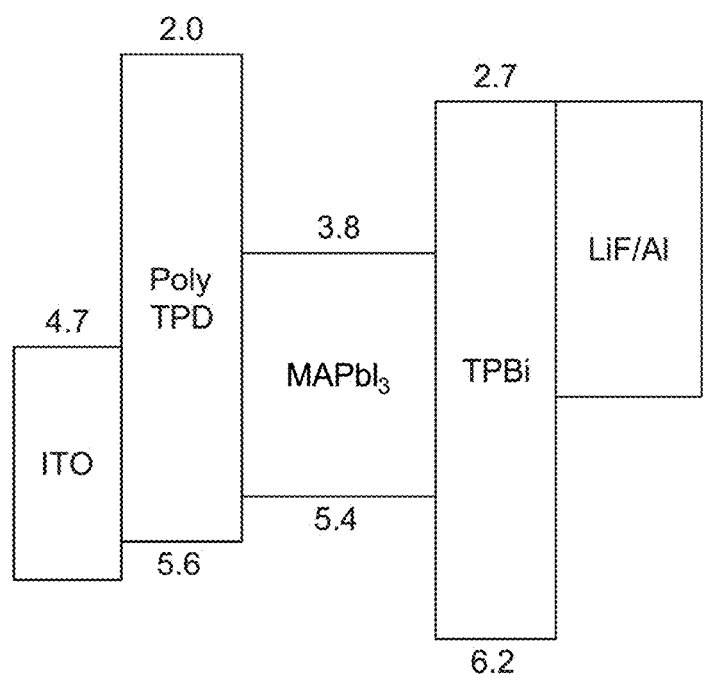
Figure 15B:
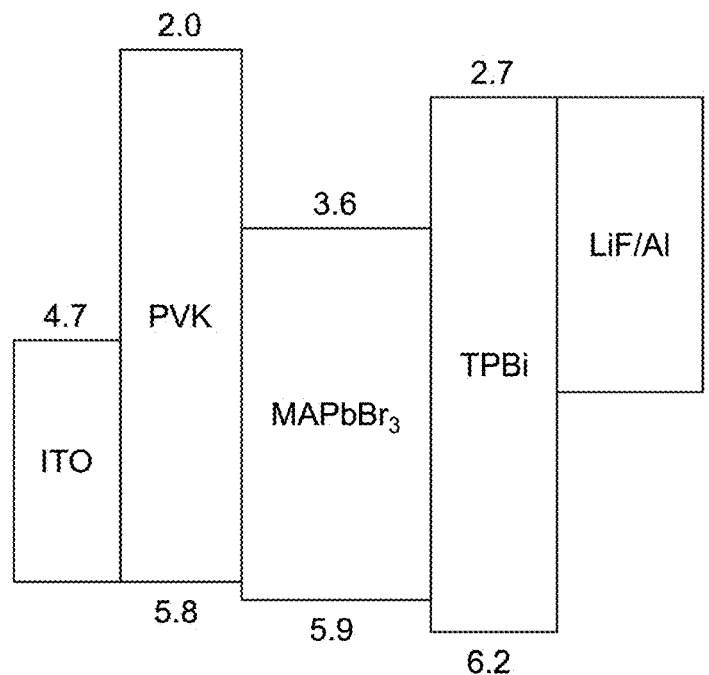
FIG. 15b is the schematic energy band diagram for the LED device of FIG. 14b.

To examine the effect of the film composition on device functionality, MAPbI$_3$ LEDs were fabricated with a device structure of ITO (150 nm)/poly-TPD (25 nm)/MAPbI$_3$ perovskite (50 nm)/TPBi (40 nm)/LiF (1.2 nm)/Al (100 nm) (ITO: indium tin oxide; poly-TPD: poly[N,N'-bis(4-butylphenyl)-N,N'-bis(phenyl)-benzidine]; TPBi: 2,2',2"-(1, 3,5-benzinetriyl)-tris(1-phenyl-1-H-benzimidazole)), where poly-TPD serves as a hole-transporting and electron-blocking layer and TPBi as an electron-transporting and hole-blocking layer. FIGS. 14a and 14b shows cross-sectional TEM images of the LEDs, which confirms the film thicknesses. FIG. 14a is a cross-sectional TEM wherein the organic-inorganic perovskite layer of the LED does not include FPMAI additive, and FIG. 14b is a cross-section TEM wherein the organic-inorganic perovskite layer of the LED includes FPMAI additive. The corresponding schematic energy band diagrams of the LED devices are shown in FIGS. 15a and 15b. FIG. 15a is the schematic energy band diagram for the LED device of FIG. 14a, and FIG. 15b is the schematic energy band diagram for the LED device of FIG. 14b.

Figure 16A:
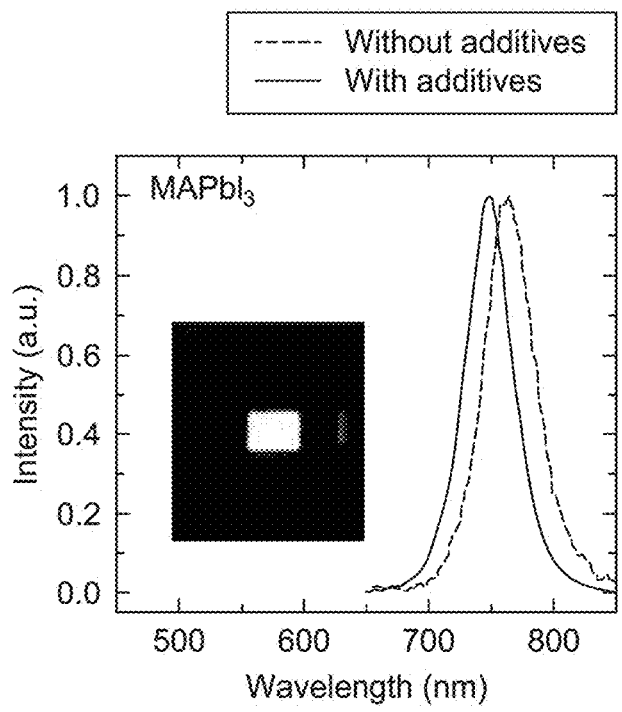
FIG. 16a illustrates electroluminescence (EL) of the LED devices of FIGS. 14a and 14b, with and without FPMAI additives respectively.
Figure 16B:
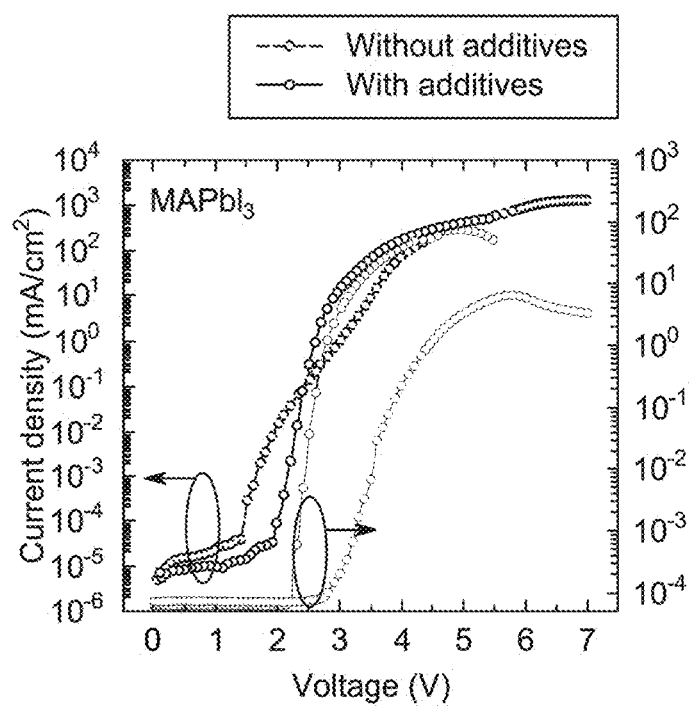
FIG. 16b illustrates current density-radiance-voltage (J-R-V) curves of the LED devices of FIGS. 14a and 14b, with and without FPMAI additives respectively.
Figure 16C:
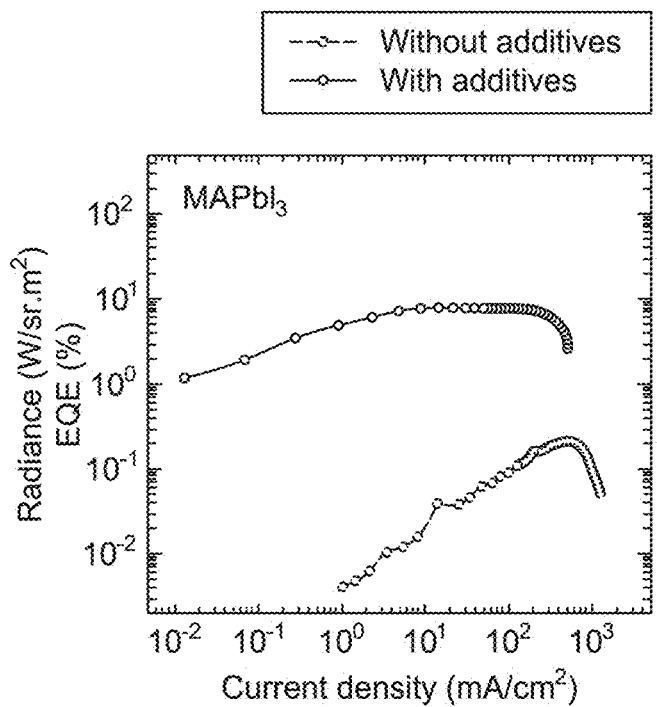
FIG. 16c illustrates EQE vs. current density curves of the LED devices of FIGS. 14a and 14b, with and without FPMAI additives respectively.

FIG. 16a shows the electroluminescence (EL) spectra of devices with and without FPMAI additives, with an image of a working LED (with FPMAI additives) shown as an inset. Similar to the PL spectra, the EL emission peak is also blue-shifted from 764 to 749 nm for devices with FPMAI additives, due to the much smaller perovskite crystal size. FIG. 16b shows the current density-radiance-voltage (J-R-V) curves for devices with and without FPMAI additives. A maximum radiance as high as 72 W/(sr·m$^2$) is achieved, which is 12 times higher than that of a device without additives. The angular emission intensity of the device follows a Lambertian profile. The EQE vs. current density curves are shown in FIG. 16c. Without the FPMAI additives, a peak EQE of 0.2% was observed. With the additives, a peak EQE of 7.9% was achieved, a 40-fold improvement. This device performance enhancement is consistent with the improvements in PLQY and lifetime observed due to FPMAI surface passivation effects. However, it should be noted that the bimolecular recombination pathway responsible for radiative recombination that controls the value of both EQE and PLQY is dependent on carrier density. The peak EQE is achieved at a condition with a higher carrier density than the condition when we perform the PLQY measurement, which explains the higher value of peak EQE than the measured PLQY.

Figure 16D:
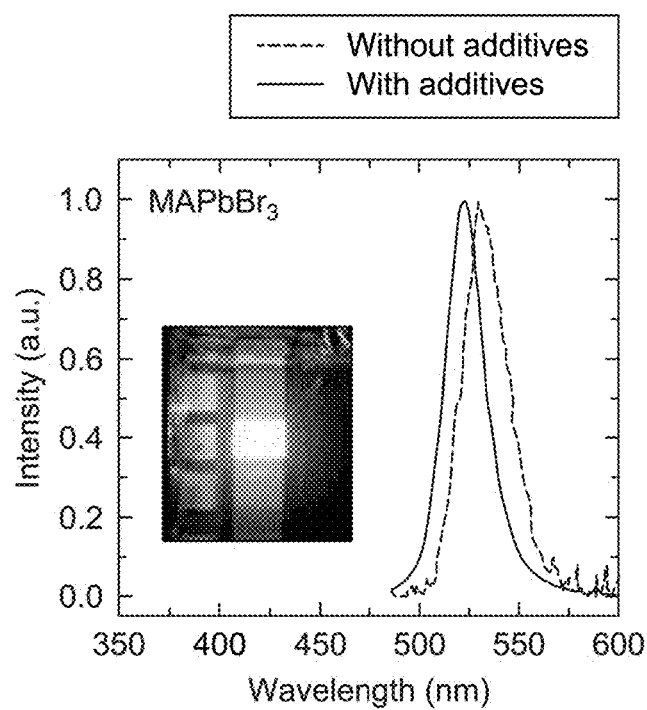
Figure 16E:
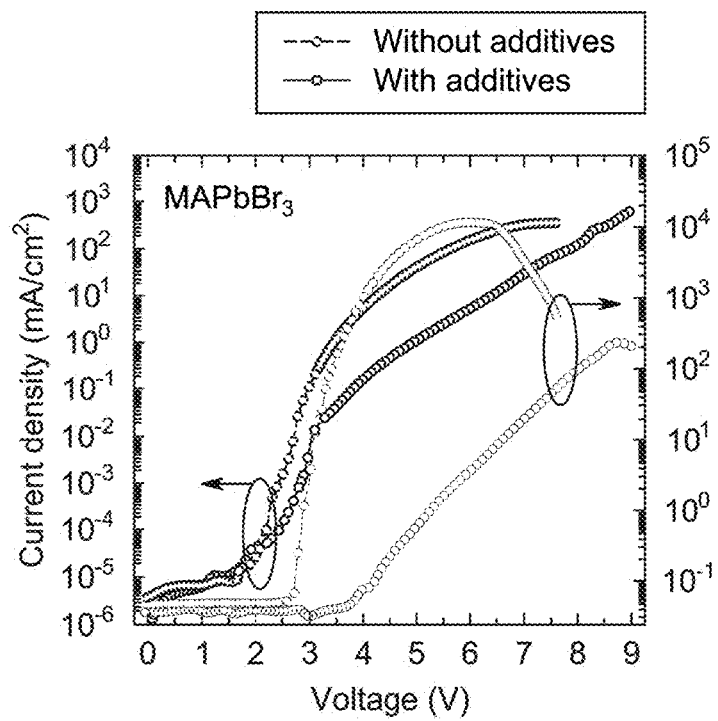
Figure 16F:
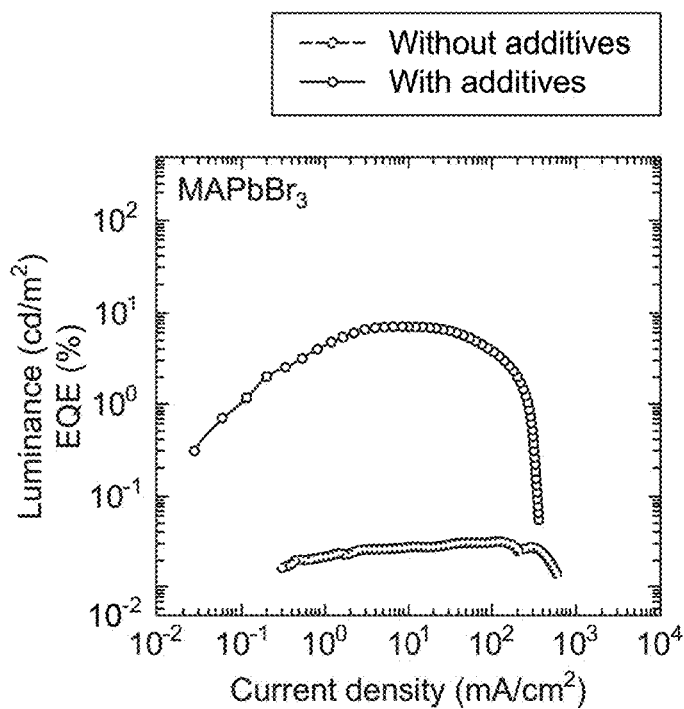
Figure 17A:
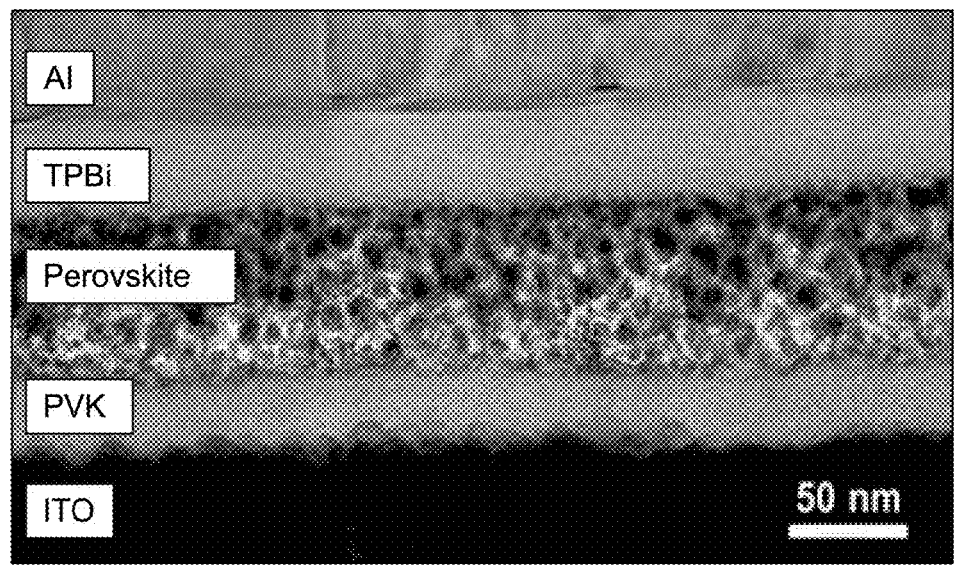
FIG. 17a illustrates an LED device with PEABr additive according to some embodiments.
Figure 17B:
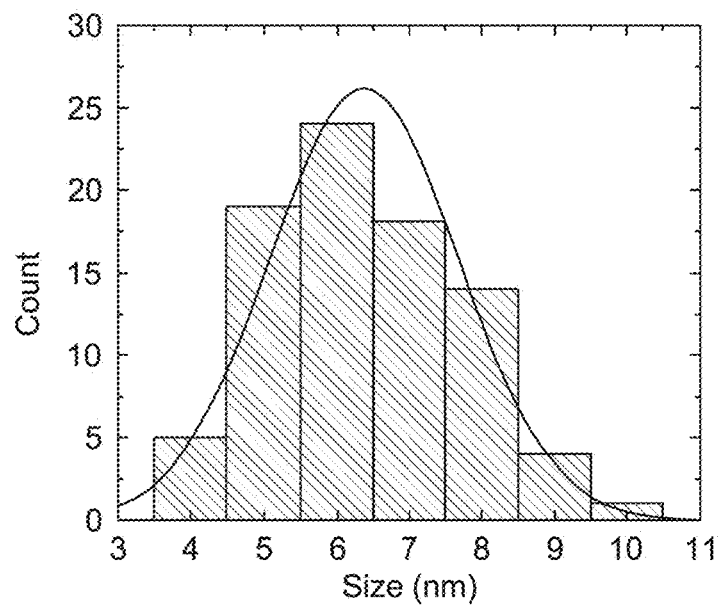
FIG. 17b is a histogram of organic-inorganic perovskite nanocrystal size according to some embodiments.

To demonstrate the versatility of our technique, we employed similar in-situ preparation strategies with another kind of bulky organoammonium halide (phenethylammonium bromide, PEABr) as an additive to form MAPbBr$_3$ nanocrystalline films. An average particle size of 6.4 nm is achieved, with a standard deviation of 1.3 nm as provided in FIG. 17b. Consistent with our findings on the MAPbI$_3$ system, MAPbBr$_3$ films processed with additives also show a blue-shifted PL peak wavelength, increased PLQY (from 0.4% to 10.9%), and TRPL decay lifetime (from 1.6 ns to 9.5 ns), compared to samples processed without additives. Green LEDs were fabricated with a similar device structure as MAPbI$_3$ LEDs except for substituting poly(N-vinylcarbazole) (PVK) for poly-TPD as the hole-transporting and electron-blocking layer. Electroluminescence spectra, current density-luminance-voltage (J-L-V) and EQE curves are shown in FIG. 16d-16f. The peak luminance is increased from 220 to 11400 cd/m$^2$, and EQE is increased from 0.3% to 7.0% by introducing the additives into the perovskite layer.

Figure 18A:
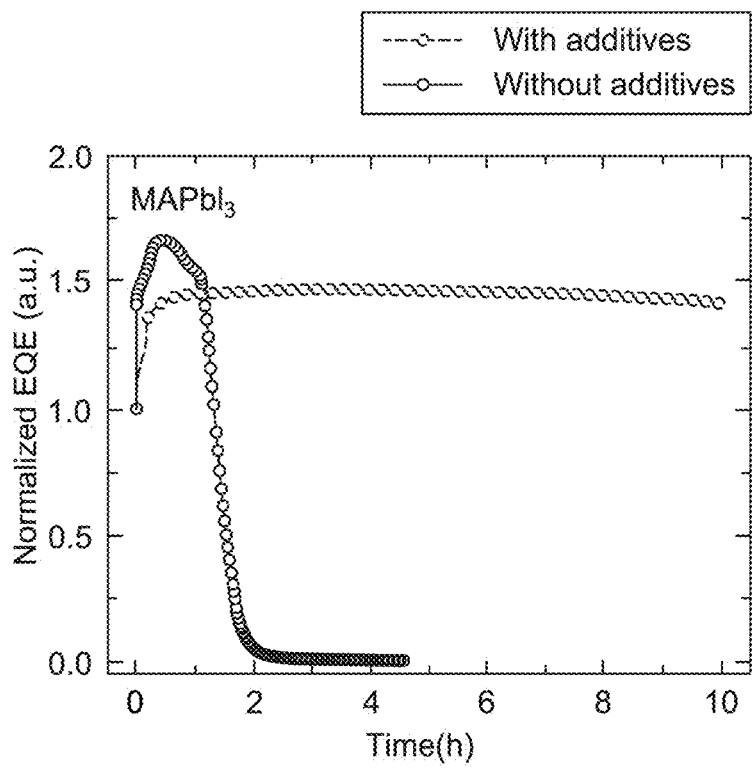
FIGS. 18a and 18b illustrate operation stability of MAPbI and MAPbBr LEDs respectively at constant current density of 3 mA/cm$^2$ according to some embodiments.
Figure 18B:
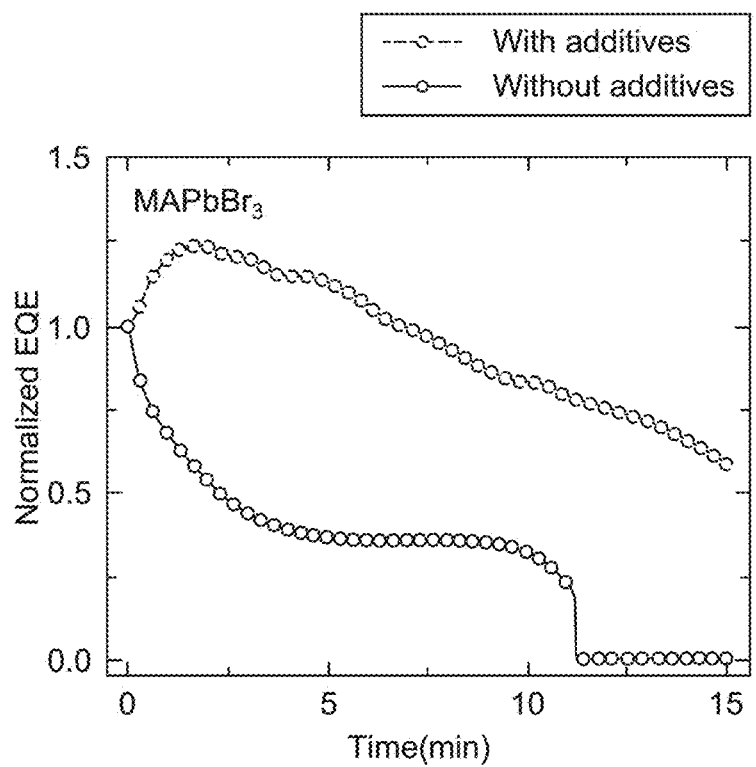

Concerning stability, devices employing in-situ preparation strategies described herein show significantly improved operational stability. As shown in FIG. 18a, the EQE of the additive confined MAPbI$_3$ LEDs show minimal degradation over 10 h under a constant current density of 3 mA/cm$^2$, while the EQE of MAPbI$_3$ LEDs without additives are not functional within 2 h of constant stress. Considering that ion migration is known to occur in perovskite devices, this process can alter the internal field profile, induce unintended chemical interactions and create defects, all of which can degrade device performance. It is possible that the bulky additives improve stability either because they encapsulate the particle or because the matrix that separates perovskite particles impedes ionic motion. Furthermore, the additive confined MAPbI$_3$ LEDs show no obvious efficiency degradation after storage in N$_2$ for four months, further suggesting improved material stability. The MAPbBr$_3$ LEDs with additives also show improved device stability compared to devices without additives, though the MAPbBr$_3$ LEDs are considerably less stable than the MAPbI$_3$ LEDs (FIG. 18b), which is consistent with a previously reported study showing that MAPbBr$_3$ is intrinsically less stable than MAPbI$_3$. Synthesis of organic cation salts MAI, FPMAI, MABr and PEABr crystals were synthesized by mixing methylamine, 4-fluorophenylmethylamine, and phenethylamine (Sigma Aldrich) with HI or HBr (Sigma Aldrich) in a 1:1 molar ratio, respectively. The reaction was performed in an ice bath while stirring for 3 h. The solvent of the resulting solution was evaporated using a rotary evaporator. The MAI, FPMAI, MABr and PEABr was recrystallized from an isopropyl alcohol:toluene mixture. Finally, the large crystals were filtered and dried under low heat. Recrystallization, filtration, and drying were performed inside a N$_2$ filled glovebox.

Perovskite film deposition and device fabrication PbI$_2$ (PbBr$_2$) and MAI (MABr) were dissolved in DMF (Sigma Aldrich, 99.8% anhydrous) to obtain 0.4 M MAPbI$_3$ (MAPbBr$_3$) solution. Additives (FPMAI or PEABr) were mixed with the perovskite precursor (MAPbI$_3$ or MAPbBr$_3$) in a 0.2:1 molar ratio. Poly-TPD (6 mg/ml in chlorobenzene) or PVK (6 mg/ml in chlorobenzene) was spin coated on glass substrates with pre-patterned indium-tin-oxide (ITO) at 1500 rpm for 70 s followed by thermal annealing at 150 or 120° C. for 20 min. Poly-TPD was then treated with O$_2$ plasma for 1 s to improve wetting. Perovskite films (with or without additives) were deposited on poly-TPD or PVK by spin coating at 6000 rpm. A solvent exchange step is performed after 3.5 s by dropping toluene on the spinning samples. Then, samples were annealed at 70° C. for 5 min. TPBi, LiF and Al layers were thermally evaporated with thicknesses of 40 nm, 1.2 nm and 100 nm, respectively. Device area is 0.1 cm$^2$.

Material and device characterization Film surface morphologies were surveyed by an FEI Verios 460 XHR SEM. Crystal structures of the films were studied by using a Bruker D8 Discover X-ray diffractometer with incident wavelength of 0.154 nm. Surface topography of the films were imaged with a Bruker Nanoman AFM. Chemical contents of the films were characterized by using a Thermo Scientific Kalpha XPS System. Samples were directly transferred to the XPS chamber without air exposure in order to avoid surface contamination and oxidation. Cross-section TEM lamella samples of the devices were prepared by an FEI Helios DualBeam microscope. HRTEM images, electron nanodiffraction and EDS measurements were carried out in an FEI Talos (S)TEM at 200 kV. Steady-state and TRPL measurements were carried out using an FLS980 spectrometer (Edinburgh Instruments). Samples were excited at 470 nm from a Xe arc lamp for the steady-state PL measurements. For the TRPL measurements, MAPbI$_3$ samples with (without) additives were excited at 634.8 nm by a pulsed laser diode with a 500 ns pulse period and detection wavelength of 749 nm (764 nm); MAPbBr$_3$ samples with (without) additives were excited at 374.4 nm by a pulsed laser diode with a 500 ns pulse period and detection wavelength of 530 nm (521 nm). PLQY was measured using a Petite integrating sphere coupled to the PTI QuantaMaster 400 Steady State Fluorometer system. Excitation wavelengths of 450 nm and 400 nm were used for MAPbI$_3$ and MAPbBr$_3$ films, respectively. The following settings were kept the same for all films: bandpass values of 5 nm for both the excitation and emission slits, step increments of 1 nm and integration times of 0.5 s per data point. The excitation intensity was 2 mW/cm$^2$. Characteristics of perovskite LEDs were measured in a N$_2$ glovebox using a custom motorized goniometer consisting of a Keithley 2400 sourcemeter unit, a picoammeter (4140B, Agilent), a calibrated Si photodiode (FDS-100-CAL, Thorlabs), and a calibrated fiber optic spectrophotometer (UVN-SR, StellarNet Inc.).

Example 3

Mixed Halide Organic-Inorganic Perovskite Films and Light Emitting Diodes Incorporating the Same In this example, the formation of stable mixed-halide perovskite films is described by alleviating the phase instability caused by lattice inconsistency using mixed MA/Cs cations, and more critically, suppressing halide redistribution/migration by forming nanometer-sized crystallites with self-assembled long-chain organic cation (e.g. n-butylamomium (BA)) capping layers. Using these phase stable mixed-halide perovskite films, we are able to fabricate high efficiency LEDs with tunable emission wavelengths, and solar cells with tunable $V_{OC}$. The peak emission wavelength of mixed-halide LEDs using stable $BAI_{1-x}Br_x$—$Cs_{0.6}MA_{0.4}Pb(I_{1-x}Br_x)_3$ are gradually tuned from 750 nm to 520 nm. In contrast, the emission of LEDs made from $MAPb(I_{1-x}Br_x)_3$ and $Cs_yMA_{1-y}Pb(I_{1-x}Br_x)_3$ (0<x<1, 0<y<1) were pinned at 720 nm and 695 nm respectively, corresponding to the emission from the x=0.2 perovskite. In addition, we demonstrate that the $V_{OC}$ of solar cells using $BAI_{1-x}Br_x$—$Cs_{0.6}MA_{0.4}Pb(I_{1-x}Br_x)_3$ can be gradually tuned from 1.05 V to 1.45 V, whereas the $V_{OC}$ of the solar cells fabricated with $MAPb(I_{1-x}Br_x)_3$ and $Cs_{0.6}MA_{0.4}Pb(I_{1-x}Br_x)_3$ became pinned below 1.15 V due to the I-rich perovskite domains.

Three categories of films were investigated in this example: $MAPb(I_{1-x}Br_x)_3$, $Cs_{0.6}MA_{0.4}Pb(I_{1-x}Br_x)_3$, and $BAI_{1-x}Br_x$—$Cs_{0.6}MA_{0.4}Pb(I_{1-x}Br_x)_3$, with 0<x<1 for each category. All films were prepared by a solvent exchange approach with thicknesses in the range of 50-70 nm. It was found that the PL emission of the as-prepared $Cs_yMA_{1-y}Pb(I_{0.6}Br_{0.4})_3$ films gradually blue-shift toward its band edge with Cs molar ratio increasing up to 60% (as in $Cs_{0.6}MA_{0.4}Pb(I_{0.6}Br_{0.4})_3$), suggesting no phase separation in the as-prepared films. Long-chain ammonium halides, such as BAI, are too large to fill in the octahedral corner of the lead halide perovskite crystal structure and, when incorporated into a precursor solution, act as a surfactant that impedes the grain growth of three-dimensional (3D) perovskite crystallite. Unless otherwise noted, the molar ratio of $BAI_{1-x}Br_x$ to $Cs_{0.6}MA_{0.4}Pb(I_{1-x}Br_x)_3$ is fixed at optimal ratio of 20:100 according to previous work detailed in Examples 1 and 2 and the molar ratio of I to Br of $BAI_{1-x}Br_x$ was kept the same as $Cs_{0.6}MA_{0.4}Pb(I_{1-x}Br_x)_3$.

The absorption edge gradually blue shifts with increasing Br molar ratios for all films. It was noted that the $Cs_{0.6}MA_{0.4}PbI_3$ (x=0) film exhibits weak absorption, likely due to the different crystal structure of tetragonal $MAPbI_3$ and cubic $CsPbI_3$. All films showed negligible change in their absorption spectra after an illumination stress (20 min of simulated 1 sun (AM1.5G) illumination in $N_2$), indicating that the light induced I-rich domains do not dominate the volume of these films, and that the absorption of I-rich domains are not apparent.

The PL peaks of the $MAPb(I_{1-x}Br_x)_3$ films (0<x<1) are pinned at the infrared range even before illumination stress, suggesting that I-rich domains may already exist in the as-prepared film and/or forms during the initial PL measurement. The phase instability of $MAPb(I_{1-x}Br_x)_3$ films is due to the different crystal structure of $MAPbI_3$ and $MAPbBr_3$. Although minority I-rich domains do not contribute substantially to the absorption spectra, PL originates from the I-rich domains due to energy transfer from the larger bandgap Br-rich domains. The energy transfer is further confirmed by both time-resolved PL and ultraviolet photoelectron spectroscopy (UPS) measurements.

Initially, the PL of fresh $Cs_{0.6}MA_{0.4}Pb(I_{1-x}Br_x)_3$ films match the optical bandgap, suggesting that Cs ions with smaller radius improve the halide mixing. However, after illumination stress, the PL emission undergoes a red-shift and becomes pinned in the infrared range at an energy corresponding to the peak emission from the x=0.2 perovskite. This suggests that $Cs_{0.6}MA_{0.4}Pb(I_{1-x}Br_x)_3$ films still suffer from light-induced phase separation. This is understandable considering that photo-generated polarons caused strain does not depend on the mixing of cations. However, when $BAI_{1-x}Br_x$ is incorporated as a surfactant in the mixed-halide perovskite $Cs_{0.6}MA_{0.4}Pb(I_{1-x}Br_x)_3$ films, the optical properties become stable under light stressing, as evidenced by their stable, gradually blue shifted, near-absorption edge PL.

X-ray diffraction (XRD) measurements were conducted to examine the phase composition and stability of these three categories of films before and after illumination. The (110/100) diffraction peaks of fresh $MAPb(I_{1-x}Br_x)_3$ films gradually shift to larger angles with increasing Br content, indicating Br incorporation into the lattice, consistent with the absorption spectra. After illumination, the diffraction peak bifurcates for 0.4<x<1, suggesting that the I-rich domains have considerable volume and crystallinity after illumination. After incorporation of Cs, no peak splitting was observed upon illumination, confirming that the different halides have become more miscible within the crystal structure, and that light induced I-rich domains remain small, and perhaps disordered. As expected, there is also no peak splitting for the $BAI_{1-x}Br_x$—$Cs_{0.6}MA_{0.4}Pb(I_{1-x}Br_x)_3$ films after illumination. It should be noted that no yellow orthorhombic δ-phase was formed over the entire range of phase compositions for films with Cs.

Scanning electron microscopy (SEM), high resolution transmission electron microscopy (HRTEM), and scanning TEM (STEM) based energy-dispersive X-ray spectroscopy (EDS) measurements were employed to examine the morphology and halide distribution of the films, here for the case of x=0.4. There were no obvious changes to the surface morphology of the films after illumination. The SEM images also showed that the $Cs_{0.6}MA_{0.4}Pb(I_{0.6}Br_{0.4})_3$ film exhibits smaller grain size (30-50 nm) compared to those in $MAPb(I_{0.6}Br_{0.4})_3$ (50-100 nm), whereas in the film with 20 mol % of $BAI_{0.6}Br_{0.4}$, the grain size is reduced to ~10 nm. The HRTEM images revealed that all films are comprised of crystallites of approximately 10 nm in size with different orientations. Therefore, the grains in both the $MAPb(I_{0.6}Br_{0.4})_3$ and $Cs_{0.6}MA_{0.4}Pb(I_{0.6}Br_{0.4})_3$ films contain multiple crystallites. It is very likely that the halide ions readily redistribute among adjacent crystallites within a single domain under illumination. However, after incorporation of the BA cations, nanometer-sized grains are formed and are protected against halide redistribution by the BA capping layer. In addition, due to the energy level difference between I- and Br-rich domains, it is energetically unfavorable to have phase separation inside these nanometer-sized crystallites. The redistribution of halides in $MAPb(I_{0.6}Br_{0.4})_3$ film is directly confirmed by EDS imaging. Initially, both I and Br distribution are very uniform, whereas after illumination, the halides redistribute into adjacent I-rich/Br-deficient (white arrows) and I-deficient/Br-rich (yellow arrows) regions of approximately 15 nm in size. In contrast, the halide distribution in both $Cs_{0.6}MA_{0.4}Pb(I_{0.6}Br_{0.4})_3$ and $BAI_{0.6}Br_{0.4}$—$Cs_{0.6}MA_{0.4}Pb(I_{0.6}Br_{0.4})_3$ films is very uniform after illumination. According to optical measurements, I-rich domains likely exist in the Cs-based film but are beyond the resolution of the EDS technique.

Figure 19A:
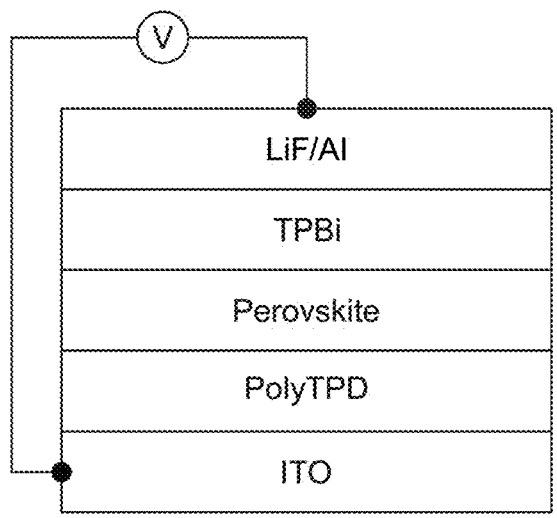
FIGS. 19a-19c show the device structure and energy levels of mixed halide organic-inorganic perovskite LEDs according to some embodiments.
Figure 19B:
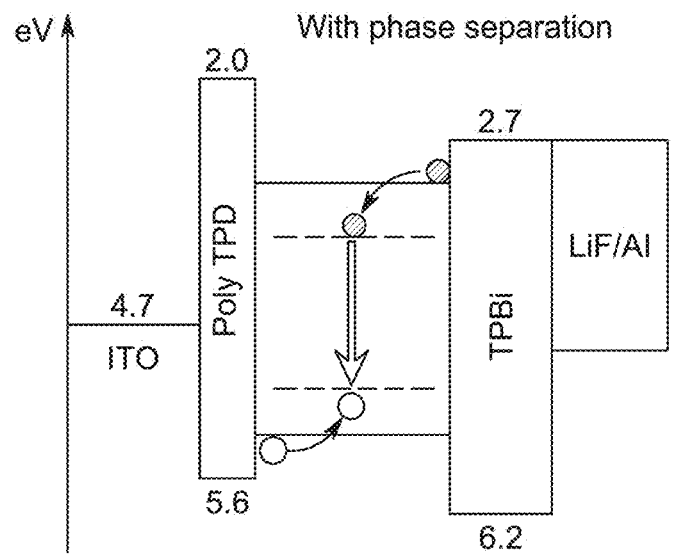
Figure 19C:
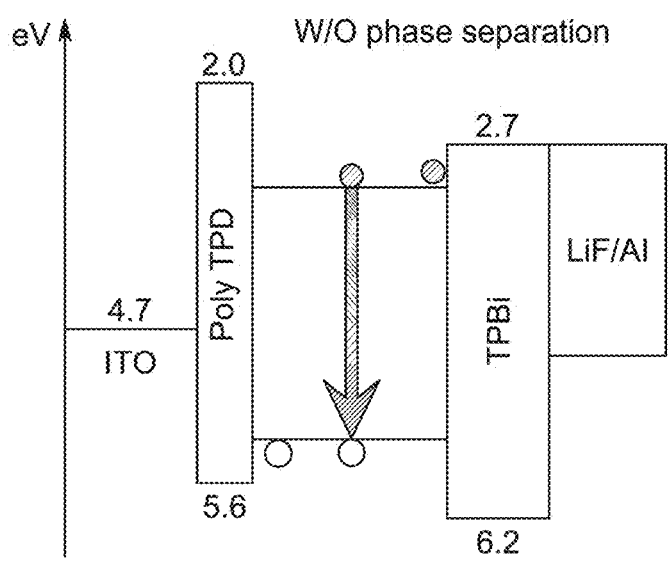

The performance of the above three categories of films were tested in both LEDs and solar cells. The perovskite LED structure is: ITO/poly-TPD (40 nm)/perovskite (50-70 nm)/TPBi (50 nm)/LiF(1.2 nm)/Al (ITO: indium tin oxide; poly-TPD: poly[N,N'-bis(4-butylphenyl)-N,N'-bis(phenyl)-benzidine]; TPBi: 2,2',2"-(1,3,5-benzinetriyl)-tris(1-phenyl-1-H-benzimidazole)). FIGS. 19a-19c show the device structure and energy levels of the perovskite LEDs. It should be noted that the LEDs generally work at high voltages and injection current. Therefore, the electric field-induced halide migration and subsequent phase segregation is severe under these working conditions. It is clear that the EL emission of both $MAPb(I_{1-x}Br_x)_3$ and $Cs_{0.6}MA_{0.4}Pb(I_{1-x}Br_x)_3$ based LEDs with x<1 are pinned in the infrared range, suggesting that the halide redistribution and phase separation already occurred during the voltage scanning process. The visible EL from LEDs of both of these categories are very weak due to the low EQE and primarily infrared emission spectra. The low EQE are likely due to non-radiative traps caused by I-rich domains. However, the nanometer-sized grains capped with long-chain ammonium cations effectively prevent halide redistribution and phase segregation under working conditions. The EL peaks of $BAI_{1-x}Br_x$—$Cs_{0.6}MA_{0.4}Pb(I_{1-x}Br_x)_3$ based devices can be gradually tuned from infrared to green with much higher EQEs. For devices formed with x=0.4, the highest EQE reached 5% for red LEDs with 650 nm emission. For comparison, the highest reported values for red LEDs using $MAPbIBr_2$ film (x=0.67) is 0.1%. The high EQE values are the result of two main factors: (1) suppressed formation of lower bandgap I-rich domains, and (2) the physical confinement of electrons and holes within the nanometer-sized grains, which is favorable for radiative recombination The tunable emission wavelength also enables high luminance for LEDs with different halide ratios. This contrasts with the low luminance of both $MAPb(I_{1-x}Br_x)_3$ and $Cs_{0.6}MA_{0.4}Pb(I_{1-x}Br_x)_3$ based LEDs, which emit in the infrared. It should be noted that the devices based on $BAI_{1-x}Br_x$—$Cs_{0.6}MA_{0.4}Pb(I_{1-x}Br_x)_3$ with x=0.8 (sometimes x=0.6) are not very stable under high voltages and showed gradually shifted EL. It was predicted that the phase separation in these films may be caused by halide migration induced by the high applied bias.

Figure 20A:
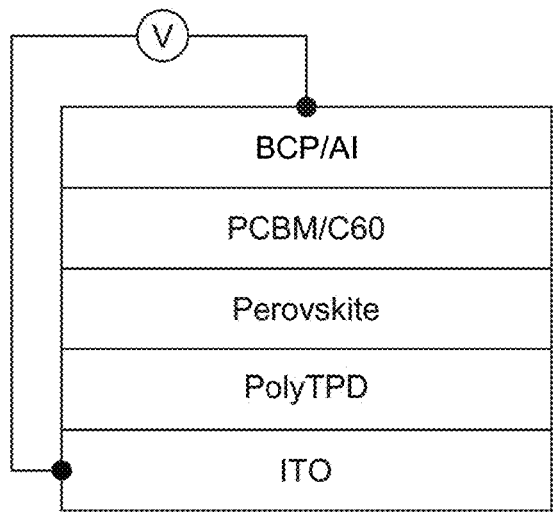
FIGS. 20a-20c shows the device structure and energy level diagrams of mixed-halide perovskite solar cells according to some embodiments.
Figure 20B:
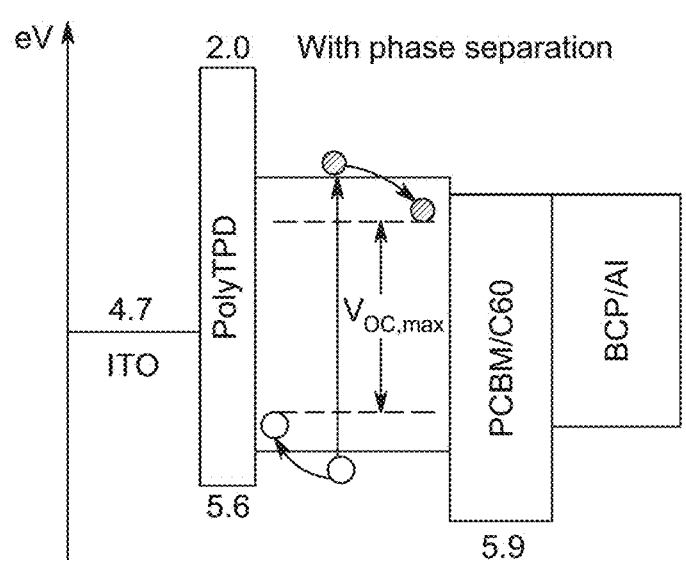
Figure 20C:
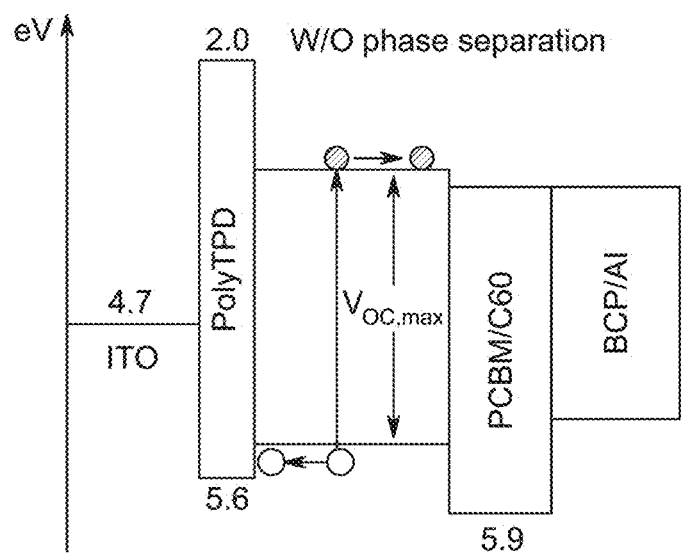
Figure 21A:
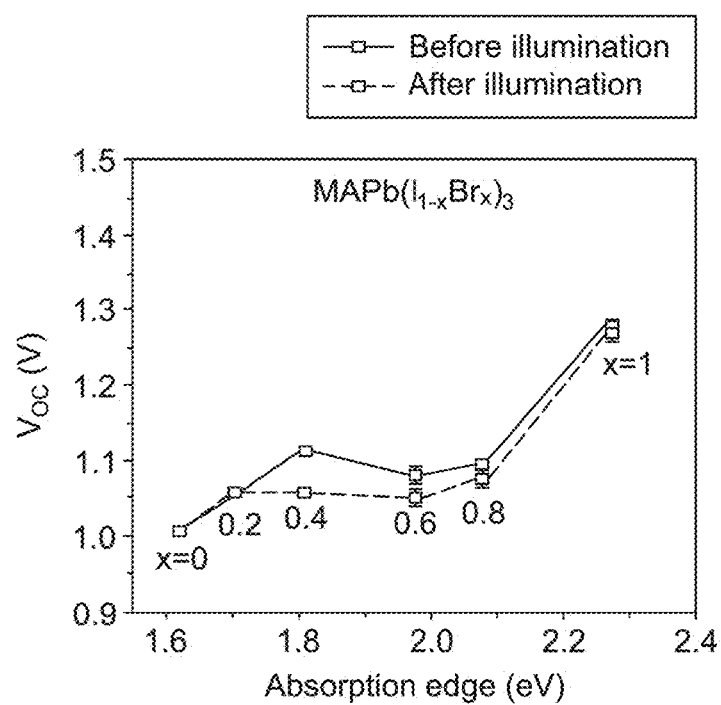
FIGS. 21a-c illustrate V$_{OC}$ of mixed halide organic-inorganic photovoltaic devices of various construction before and after illumination according to some embodiments.
Figure 21B:
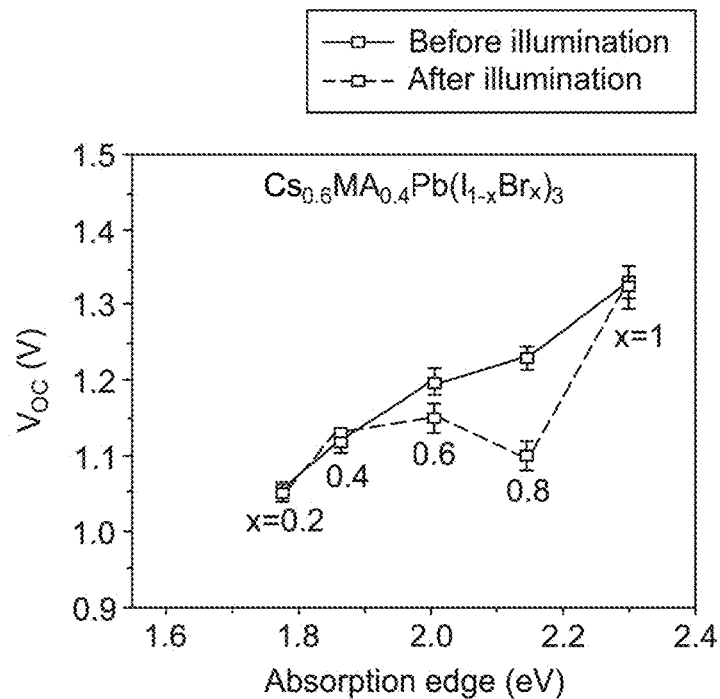
Figure 21C:
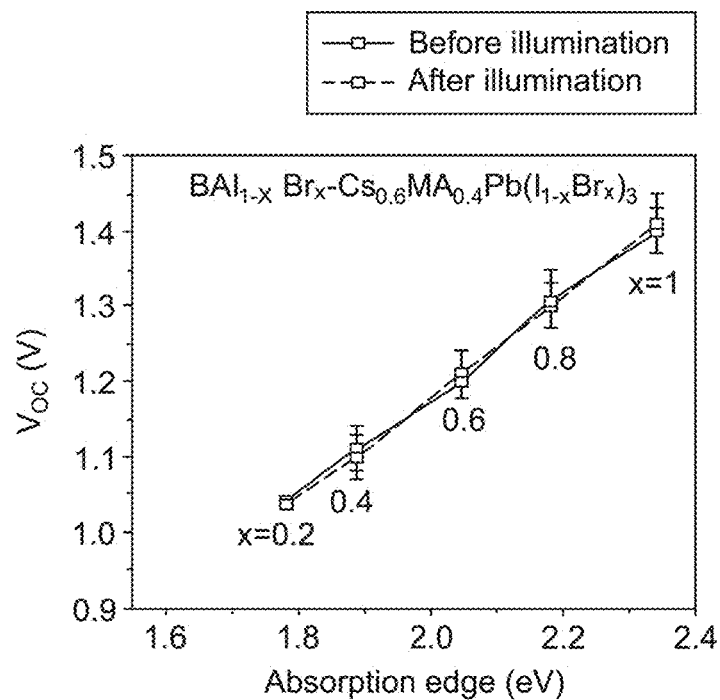

The effect of phase separation on the performance of perovskite solar cells was further evaluated. The perovskite solar cells had the following structure: ITO/poly-TPD (7 nm)/perovskite (50-70 nm)/PCBM (10 nm)/$C_{60}$ (20 nm)/BCP (8 nm)/Al (PCBM: phenyl-$C_{61}$-butyric acid methyl ester; BCP: bathocuproine). FIGS. 20a-20c shows the device structure and energy level diagrams of mixed-halide perovskite solar cells. As shown in FIG. 21a, the $V_{OC}$ of the fresh $MAPb(I_{1-x}Br_x)_3$ devices do not increase linearly with their optical absorption edge, particularly for the devices with high Br content. This further confirms that phase separation already exists in the fresh $MAPb(I_{1-x}Br_x)_3$ films or occurs during the initial solar cell measurement. The traps also cause a reduction in short circuit current density ($J_{SC}$). Both $V_{OC}$ and $J_{SC}$ of fresh $Cs_{0.6}MA_{0.4}Pb(I_{1-x}Br_x)_3$ based devices possess nearly linear relationships with the optical absorption edge before illumination. After illumination, both $V_{OC}$ and $J_{SC}$ decrease dramatically due to the light induced formation of I-rich domains, particularly for devices with high Br content. However, in line with the optical measurements, both $V_{OC}$ and $J_{SC}$ of the BA based devices show a linear relationship with their optical absorption edge, and remain stable after illumination as illustrated in FIG. 21c.

The EQE measurement directly confirms the $V_{OC}$ pinning by I-rich crystallites in both $MAPb(I_{1-x}Br_x)_3$ and $Cs_{0.6}MA_{0.4}Pb(I_{1-x}Br_x)_3$ based solar cells, indicated by its below-bandgap EQE. These experiments on solar cells further confirm that light induced phase separation is detrimental for device performance, and that incorporating long-chain organoammonium cations is an effective technique for preventing unwanted phase separation, resulting in improved $V_{OC}$.

Materials MAI, BAI were synthesized by mixing methylamine and butylamine (Sigma Aldrich) with equimolar amounts of aqueous HI (Sigma Aldrich, stabilized) at 0° C. with constant stirring under $N_2$. MABr and BABr were synthesized with analogous procedures. The organoammonium halides (MAI, BAI, MABr and BABr) were washed with an ethanol:ether mixture and rotovaped several times to remove the HI stabilizer. $PbI_2$, $PbBr_2$, CsI and CsBr were purchased from Alfa Aesar, and used as received.

Perovskite film deposition Poly-TPD was dissolved in chlorobenzene at a concentration of 6 mg/ml. Poly-TPD was spin coated on ITO at 1,000 rpm for 60 s, followed by thermal annealing at 150° C. for 20 min. Then the poly-TPD layer was treated by 02 plasma for 2 s to improve the wetting before spin coating perovskites. The $MAPbI_3$, $MAPbBr_3$ and $CsPbI_3$ precursors were dissolved in DMF (Sigma Aldrich, 99.8% anhydrous) at concentrations of 0.38 M, $CsPbBr_3$ was dissolved in DMSO (Sigma Aldrich, 99.9% anhydrous) at a concentration of 0.38 M. BAI and BABr were dissolved in DMF at concentrations of 0.76 M. $MAPbI_3$, $MAPbBr_3$, $CsPbI_3$ and $CsPbBr_3$ solutions were mixed to prepare $MAPb(I_{1-x}Br_x)_3$ and $Cs_{0.6}MA_{0.4}(I_{1-x}Br_x)_3$ solutions. Different molar amounts of BAI and BABr were added into the $Cs_{0.6}MA_{0.4}PbI_3$ and $Cs_{0.6}MA_{0.4}PbBr_3$ solutions, respectively, followed by mixing of both solutions to prepare $BAI_{1-x}Br_x$—$Cs_{0.6}MA_{0.4}(I_{1-x}Br_x)_3$ solutions. The spin coating rate was 4,000 rpm. Toluene was dropped on the spinning substrate of $MAPb(I_{1-x}Br_x)_3$ films at 5 s, and toluene:chloroform mixture (80:20 v/v) was dropped on the spinning substrate of $Cs_{0.6}MA_{0.4}(I_{1-x}Br_x)_3$ and $BAI_{1-x}Br_x$—$Cs_{0.6}MA_{0.4}(I_{1-x}Br_x)_3$ films at 20 s considering there is DMSO in the solution. All perovskite films are dried at 50° C. for 5 min to fully dry the film and ensure the full reaction of the precursors without affecting the morphology and grain size substantially. All films were encapsulated by epoxy and glass for the optoelectronic studies to exclude the effect of air exposure on light induced phase separation. The light illumination was conducted in a nitrogen glovebox under 1 sun (AM 1.5G) conditions for 20 min.

Perovskite film characterization XRD measurements were performed with a Bruker D8 Discover X-ray diffractometer with Bragg-Brentano parallel beam geometry, a diffracted beam monochromator, and a conventional Cu target X-ray tube set to 40 kV and 40 mA. Absorption spectra were measured using a Cary 5000 UV-Vis-NIR system (Agilent). The PL spectra were measured using an FLS980 spectrometer (Edinburgh Instruments) with an excitation wavelength of 380 nm.

TRPL were taken using a Horiba DeltaFlex time-correlated single photon counting system. The samples were excited by a pulsed laser diode (DeltaDiode-Horiba) with a center wavelength of 406 nm, an excitation intensity of ~4 $mW/cm^2$ and a repetition rate that is less than the reciprocal of the measurement range. The time resolution was determined to be ~100 ps from the instrument response function. All decay traces were taken at 5 nm increment and with constant run time of 10 s.

The SEM measurements were conducted with an FEI XHR (extreme high resolution) SEM (Verios 460) using immersion mode. Cross-section TEM lamella samples of the devices were prepared by an FEI Helios DualBeam microscope. A current as small as 40 pA was used for final polishing in order to effectively minimize ion-beam-induced sample damage. HRTEM images and EDS measurements were carried out in an FEI Talos (S)TEM at 200 kV.

Device fabrication and characterization For perovskite LEDs, TPBi, LiF and Al layers were sequentially thermally deposited on top of the perovskite film with thicknesses of 60 nm, 1.2 nm and 100 nm respectively. For perovskite solar cells, the concentration of Poly-TPD is 0.6 mg/ml. PCBM (20 mg/ml in chlorobenzene) was spin coated on top of perovskite film at 6,000 rpm for 50 s. Then $C_{60}$ and BCP and Al were sequentially thermally deposited on top with thicknesses of 20 nm, 8 nm and 100 nm respectively. The device area was 0.1 cm$^2$.

LEDs were measured in $N_2$ using a homemade motorized goniometer setup consisting of a Keithley 2400 sourcemeter unit, a calibrated Si photodiode (FDS-100-CAL, Thorlabs), a picoammeter (4140B, Agilent), and a calibrated fiber optic spectrophotometer (UVN-SR, StellarNet Inc.). The perovskite solar cells were measured in $N_2$ using a Keithley 2602B sourcemeter unit under simulated AM1.5G illumination from a calibrated ABET Technologies solar simulator. External quantum efficiency measurements were performed using a Newport TLS-300X tunable light source system. Device spectral response was measured under short-circuit conditions using a Stanford Research Systems SR570 current preamplifier and SR830 lock-in amplifier. A Newport calibrated Si photodetector served as the reference cell.

Various embodiments of the invention have been described in fulfillment of the various objects of the invention. It should be recognized that these embodiments are merely illustrative of the principles of the present invention. Numerous modifications and adaptations thereof will be readily apparent to those skilled in the art without departing from the spirit and scope of the invention.

The invention claimed is:

1. An optoelectronic device comprising:
a photoactive layer of organic-inorganic perovskite nanocrystals, the organic-inorganic perovskite nanocrystals comprising surfaces associated with ligands of size unable to incorporate into octahedral corner sites of the perovskite crystal structure, wherein the ligands form a matrix in which the organic-inorganic perovskite nanocrystals as dispersed.

2. The optoelectronic device of claim 1, wherein the wherein the organic-inorganic perovskite nanocrystals have an average size of 1-10 nm.

3. The optoelectronic device of claim 1, wherein the organic-inorganic perovskite nanocrystals are of the formula $ABX_{3-z}Y_z$, wherein A is an organic cation, B is an element selected from the group consisting of transition metals, Group IVA elements and rare earth elements and X and Y are independently selected from Group VIIA elements and wherein $0 \leq z < 3$.

4. The optoelectronic device of claim 3, wherein $0 < z < 3$.

5. The optoelectronic device of claim 4, wherein the ligands inhibit spinodal decomposition of the organic-inorganic perovskite nanocrystals resulting from operation of the optoelectronic device.

6. The optoelectronic device of claim 1, wherein the organic-inorganic perovskite nanocrystals are of the formula $Me_{1-y}A_yBX_{3-z}Y_z$, wherein Me is an alkali or alkaline earth metal cation, A is an organic cation, B is an element selected from the group consisting of transition metals, Group IVA elements and rare earth elements and X and Y are independently selected from Group VIIA elements, wherein $0 < y < 1$ and wherein $0 \leq z < 3$.

7. The optoelectronic device of claim 1, wherein the ligands comprise organoammonium ions.

8. The optoelectronic device of claim 7, wherein the organoammonium ions comprise one or more substituents selected from the group consisting of branched alkyl, cycloalkyl, cycloalkenyl, heterocycloalkyl, aryl, and heteroaryl.

9. The optoelectronic device of claim 7, wherein the organoammonium ions comprise one or more substituents selected from the group consisting of aryl and heteroaryl.

10. The optoelectronic device of claim 7, wherein the organoammonium ions comprise one or more substituents selected from the group consisting of 4-fluorophenylmethylammonium, phenylammonium, and phenylalkylammonium.

11. The optoelectronic device of claim 1, wherein the photoactive layer is a light emitting layer of a light emitting diode.

12. The optoelectronic device of claim 11, wherein the light emitting diode has an external quantum efficiency greater than 8.5%.

13. The optoelectronic device of claim 11, wherein the photoactive layer has a thickness of 10 nm to 200 nm.

14. The optoelectronic device of claim 11, wherein the light emitting diode further comprises a hole transport layer between the photoactive layer and an anode.

15. The optoelectronic device of claim 11, wherein the light emitting diode further comprises an electron transport layer between the photoactive layer and a cathode.

16. The optoelectronic device of claim 11, wherein the photoactive layer has a peak electroluminescence in a range of 700 nm to 800 nm.

17. The optoelectronic device of claim 11, wherein the photoactive layer has a peak electroluminescence in a range of 500 nm to 550 nm.

18. The optoelectronic device of claim 1, wherein the photoactive layer is a light absorption layer of a photovoltaic apparatus.

19. The optoelectronic device of claim 1, wherein the matrix is amorphous.

* * * * *